(12) United States Patent
Murakami et al.

(10) Patent No.: US 8,007,299 B2
(45) Date of Patent: Aug. 30, 2011

(54) APPARATUS, MOUNTING STRUCTURE, INSERTING AND PULLING JIG, AND FIXING METHOD

(75) Inventors: Hajime Murakami, Kawasaki (JP);
Yoshinori Uzuka, Kawasaki (JP);
Eichiro Okumura, Kawasaki (JP);
Takeshi Nishiyama, Kawasaki (JP);
Tatsuya Akashi, Tokyo (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/767,353

(22) Filed: Apr. 26, 2010

(65) Prior Publication Data

US 2010/0240241 A1    Sep. 23, 2010

Related U.S. Application Data

(63) Continuation of application No. PCT/JP2007/071137, filed on Oct. 30, 2007.

(51) Int. Cl.
*H01R 13/62* (2006.01)
(52) U.S. Cl. .................................... 439/157; 439/160
(58) Field of Classification Search .................. None
See application file for complete search history.

(56) References Cited

U.S. PATENT DOCUMENTS

| | | | |
|---|---|---|---|
| 4,743,715 A * | 5/1988 | Gerbert-Gaillard et al. | 200/50.26 |
| 5,993,226 A * | 11/1999 | Yamaguchi | 439/157 |
| 6,176,724 B1 * | 1/2001 | Klatt et al. | 439/326 |
| 6,361,336 B1 * | 3/2002 | Zhao et al. | 439/157 |
| 6,413,122 B2 * | 7/2002 | Fujioka | 439/680 |
| 6,913,474 B2 * | 7/2005 | Mikhail et al. | 439/157 |
| 7,589,974 B2 * | 9/2009 | Grady et al. | 361/735 |

FOREIGN PATENT DOCUMENTS

| | | |
|---|---|---|
| JP | 64-10978 | 1/1989 |
| JP | 1-268098 | 10/1989 |
| JP | 3-88276 | 9/1991 |
| JP | 11-68357 | 3/1999 |
| JP | 11-274765 | 10/1999 |
| JP | 2001-126810 | 5/2001 |
| JP | 2001-210977 | 8/2001 |

OTHER PUBLICATIONS

English Translation of the International Preliminary Report on Patentability mailed Jun. 10, 2010 in corresponding International Patent Application PCT/JP2007/071137.
International Search Report for PCT/JP2007/071137, mailed on Feb. 12, 2008.

* cited by examiner

*Primary Examiner* — Michael C Zarroli
(74) *Attorney, Agent, or Firm* — Staas & Halsey LLP

(57) ABSTRACT

An apparatus includes a first substrate, a first connector disposed on a top face of the first substrate, a to-be-fixed member disposed on a back face of the first substrate, a second substrate disposed facing the first substrate, a second connector disposed on the second substrate and connected to the first connector, and a fixing module disposed on the second substrate and pivoting a locking arm using a rotating shaft, wherein the to-be-fixed member is pushed by a pushing portion provided at a tip of the locking arm when the locking arm is at a first position.

9 Claims, 40 Drawing Sheets

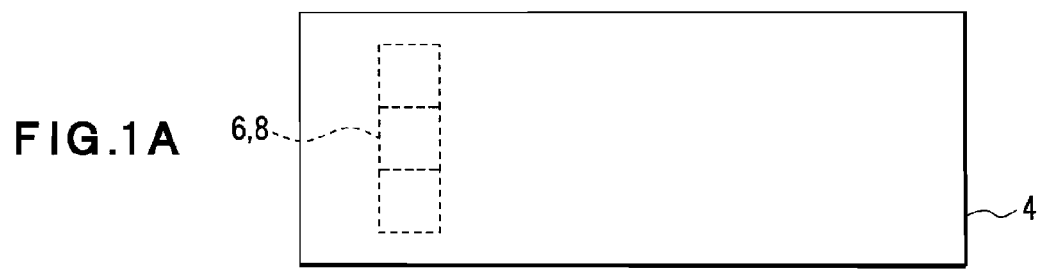
FIG.1A
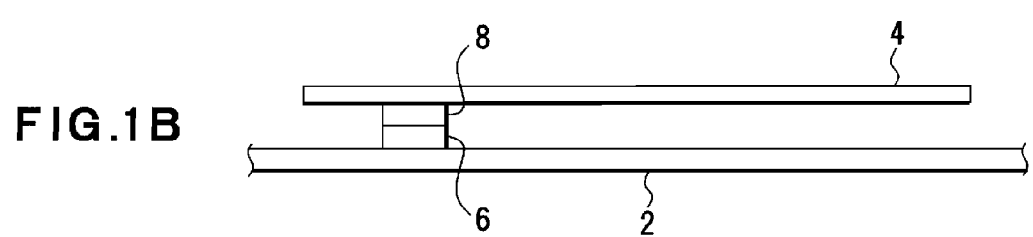
FIG.1B

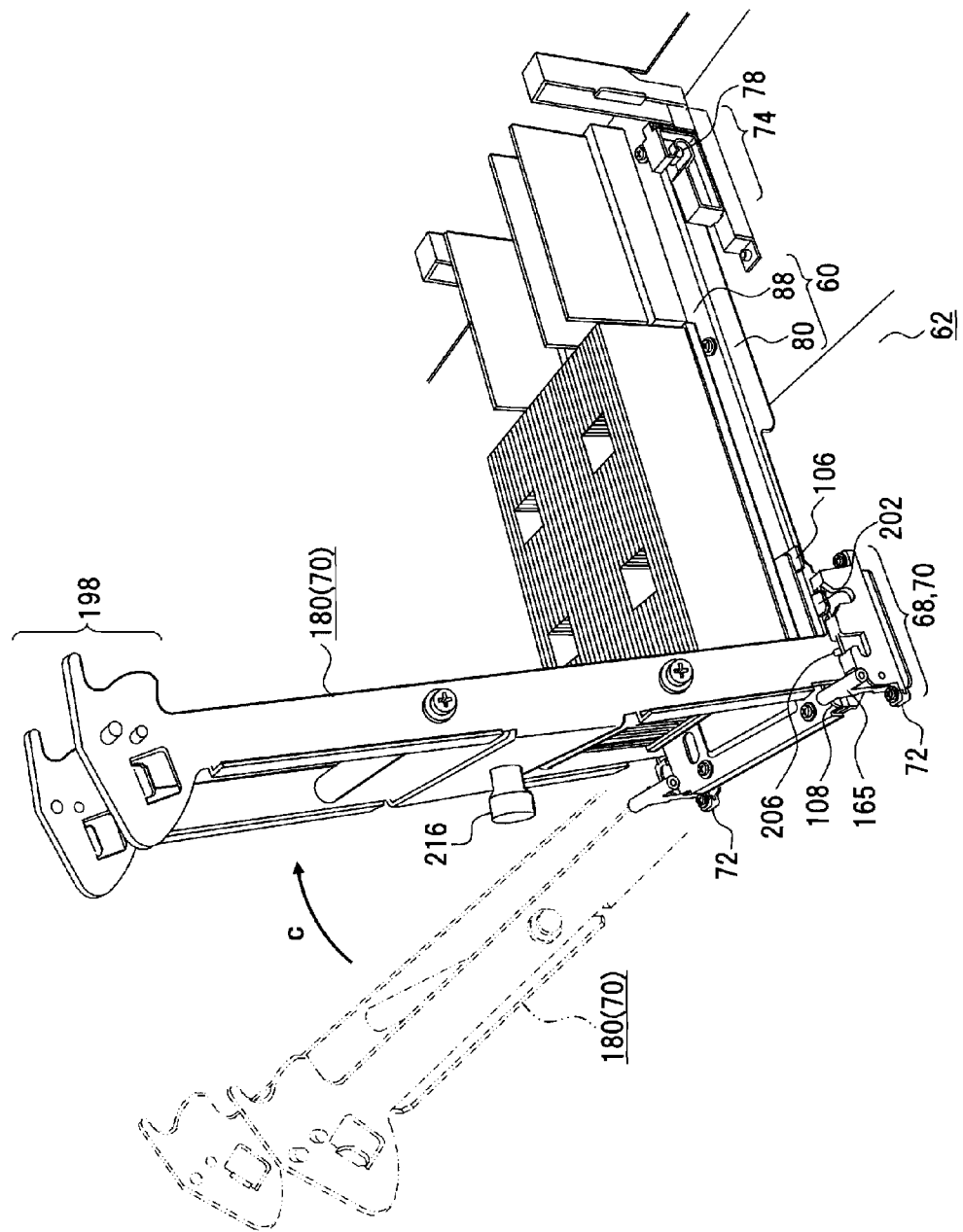

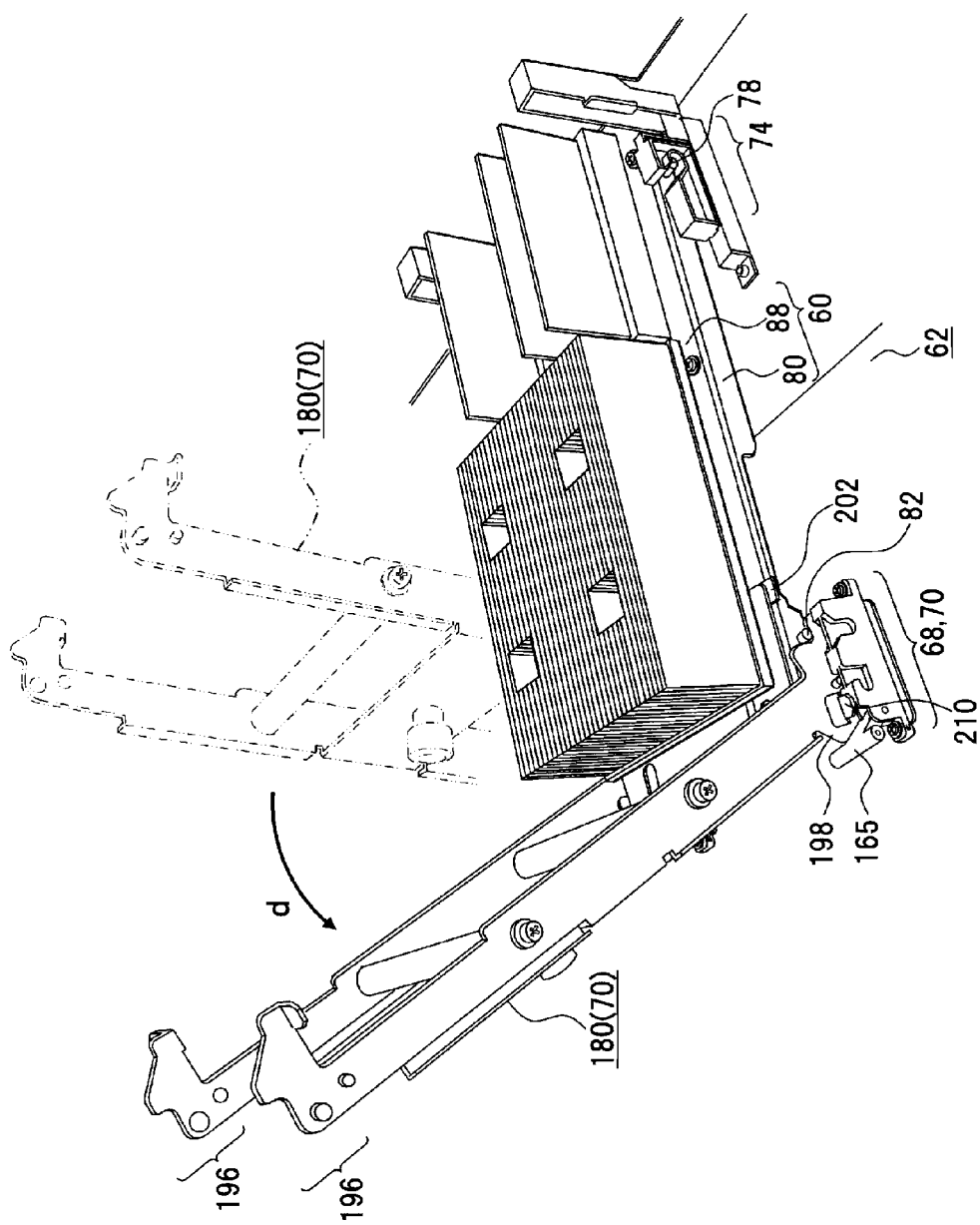

APPARATUS, MOUNTING STRUCTURE, INSERTING AND PULLING JIG, AND FIXING METHOD

This application is a continuation of International Application No. PCT/JP2007/071137, filed on Oct. 30, 2007, now pending, herein incorporated by reference.

FIELD

The embodiments discussed herein are related to an apparatus, mounting structure, and inserting and pulling jig and fixing method.

BACKGROUND

A structure for a connection using connectors or the like is used for a connection of a module substrate that is mounted on a printed board.

Concerning such a connection between substrates, Japanese Laid-Open Patent Publication No. 2001-210977 discloses a mounting structure that is a plug-in mounting structure adapted to insert a PWB (Printed Wiring Board: a plug-in-mounted-type printed wiring board) along a card guide from a front face of a housing and fit the PWB into a back face connector, including: a stopper portion that rotates centering a pin and that applies its own weight to an edge of the PWB to allow the PWB to be automatically locked when the PWB is fitted into the connector without adding any unplugging preventing structure to an ejector portion, to allow the PWB to be released at a touch, and to enable easy designing thereof and; a bracket that is integrated in the stopper portion and that includes a lever unit to operate; a card guide that includes a groove for the stopper portion to escape into when the PWB is inserted or pulled out; and PWB that includes a groove for the stopper portion to fall into simultaneously when its own connector and a connector of a mother board fit each other (Abstract and FIG. 2).

Japanese Laid-Open Patent Publication No. 11-274765 discloses a substrate fixing tool used to attach and detach a printed substrate according to which: the substrate fixing tool includes a base having a flat portion to be fixed to a mother board, and a locking piece provided being movable upward and downward in a receiving hole provided for the base; a daughter board is mounted on the flat portion of the base; the locking piece configured by a member having a substantially U-shaped cross section includes a sliding shaft that is provided in the vicinity of a bended portion of the locking piece and that is slidably supported on the base; a pawl that holds the daughter board sandwiching the daughter board with the flat portion is formed on a free end of the locking piece; and a hooking protrusion that engages with a hooking piece of the base is formed on the other free end of the locking piece (Abstract and FIG. 2).

Concerning a connection between substrates, according to the mounting structure described in Japanese Laid-Open Patent Publication No. 2001-210977, complicated operations are necessary as follows: the bracket attached to the card guide rotates centering the pin; the stopper portion on the tip falls into the groove of the printed board and is locked at the moment of the fitting of the connector when the printed board is inserted; the ejector is pulled up with the stopper being detached from the groove by pulling down the lever of the bracket; and the printed board is pulled out.

According to the substrate fixing tool described in Japanese Laid-Open Patent Publication No. 11-274765, the structure of the substrate fixing tool is complicated as follows: when the rotatable locking piece is pulled down outward, the daughter board is mounted on the mother board and is joined by a connector with the mother board; the locking piece is pulled up and the end of the daughter board is fixed by the pawl; and the other end of the locking piece is a locking releasing lever.

As depicted in FIGS. 1A and 1B, when a plurality of module substrates 4 are mounted on a printed board 2 such as a mother board, connectors 6 and 8 that connect the printed board 2 and the module substrates 4 to each other are disposed between the printed board 2 and the module substrates 4 and, therefore, the connectors 6 and 8 are covered by the module substrates 4 when the module substrates 4 are horizontally mounted to the printed board 2, etc. Therefore, inconvenience has arisen that the connection state of the connectors 6 and 8 is unable to be checked by its appearances. As depicted in FIG. 2, even when the connection state of the connectors 6 and 8 is incomplete, this state is unable to be checked by its appearances.

As depicted in FIG. 3, when vibrations act on an apparatus that is mounted with the printed board 2 or vibrations, etc., are applied to the connectors 6 and 8 that connect the printed board 2 and the module substrate 4 to each other and, thereby, a force F acts on the module substrate 4, the connector 8 may be unplugged from the connector 6. To prevent this unplugging, as depicted in FIG. 4, a locking mechanism 10 to lock the connectors 6 and 8 to each other is necessary between them. In the locking mechanism 10: a pair of fixing bases 12 are installed on the printed board 2 sandwiching the module substrate 4 therebetween; each locking metal fitting 14 installed astride the module substrate 4 is fixed to the fixing base 12 using a fixing screw 16, and, thereby, the connection by each of the connectors 6 and 8 is reinforced. Such installation of the locking parts causes an increase of the cost.

An inserting and pulling mechanism 18 is used for insertion and pulling out of the module substrate 4 into/from the printed board 2 as depicted in FIGS. 5 and 6. FIG. 5 depicts the printed board 2 that includes the inserting and pulling mechanism 18. FIG. 6 is a side view of FIG. 5. In the inserting and pulling mechanism 18, inserting and pulling jig receiving units 20 are installed to the printed board 2 sandwiching the module substrate 4 therebetween, and an inserting and pulling jig 22 is included that is attachable and detachable to/from the inserting and pulling jig receiving unit 20 and that inserts and pulls out the module substrate 4. The inserting and pulling jig 22 includes a lever arm 24 and an L-shaped abutting portion 26 formed therein and also includes a fulcrum portion 28 in a bordering portion between the lever arm 24 and the abutting portion 26. In the vicinity of the fulcrum portion 28, a pin 32 is provided protruding to be inserted into a groove 30 in the inserting and pulling jig receiving unit 20. As depicted in FIGS. 7A, 7B and 7C, the pin 32 is inserted into the groove 30 of the inserting and pulling jig receiving unit 20, thereby, the lever arm 24 is supported by the inserting and pulling jig receiving unit 20, the lever arm 24 is rotated centering the pin 32 of the inserting and pulling jig 22, the abutting portion 26 is pushed against the module substrate 4, and, thereby, the module substrate 4 can be pulled up.

When it is necessary to provide the inserting and pulling mechanism 18 and to insert and pull out the module substrate 4 using the inserting and pulling jig 22 and the locking metal fitting 14 is also installed to the inserting and pulling jig receiving unit 20 (FIG. 9), locking work such as fixation of the locking metal fitting 14 is necessary separately from the connecting work using the connectors. The inserting and pulling mechanisms 18 are provided on both sides of the module substrate 4 and, therefore, an operation using the single inserting and pulling jig 22 causes imbalance and the module substrate 4 may not be attached and detached keeping the module substrate 4 horizontal. Moreover, the connectors 6 and 8 may be broken. Therefore, in the inserting and pulling work using the inserting and pulling jig 22, a worker is forced to execute two types of work using both of his/her hands.

For a positioning mechanism 34 for positioning the printed board 2 and the module substrate 4, a plurality of positioning through holes 36 are formed in the module substrate 4 as depicted in FIG. 8A and a positioning pin 38 is provided for the printed board 2 being protruded therefrom, that penetrates each of the positioning through holes 36 as depicted in FIG. 8B. Therefore, to connect the printed board 2 and the module substrate 4 to each other, the positioning through hole 36 is aligned with the positioning pin 38 of the printed board 2 and the module substrate 4 is superimposed on the printed board 2 and, thereby, the module substrate 4 is positioned at a predetermined position relative to the printed board 2 and, thereby, the fitting of connectors 6 and 8 to each other is executed.

To connect the module substrate 4 to the printed board 2 using the connectors, a plurality of parts are necessary as follows: the locking mechanism 10, the inserting and pulling mechanism 18 and the positioning mechanism 34 are necessary; the inserting and pulling jig 22 is indispensable for the inserting and pulling mechanism 18; etc. Therefore, the cost is increased, and stepwise work is necessary as follows: operations of the mechanism 10, 18 and 34 are necessary; and these operations each need a predetermined sequence; etc. Therefore, the assembling workability is poor.

When the plurality of module substrates 4 are inserted and pulled out, a lever similar to the inserting and pulling jig 22 can be fitted to the module substrate 4. However, the number of parts accordingly increases and the cost is increased.

When the inserting and pulling jig 22 that is usable commonly to various module substrates 4 for insertion and pulling out thereof, the number of parts can be reduced by the number of the inserting and pulling jigs 22 reduced due to the common use and the cost can be reduced. However, the module substrate 4 and the inserting and pulling jig 22 are separated from each other and the degree of freedom for the inserting and pulling jig 22 to move is increased. Therefore, due to a wrong operation, etc. of the inserting and pulling jig 22, the inserting and pulling jig 22 is made into contact with parts on the printing board 2 and parts in the vicinity of an operation area of the inserting and pulling jig 22 may be damaged.

As depicted in FIG. 9, when a plurality of module substrates 401, 402, 403, . . . are mounted on the printed board 2, the plurality of module substrates 401, 402, 403, . . . are disposed adjacent to each other. However, the locking mechanisms 10 and the inserting and pulling mechanisms 18 are installed to each of the module substrates 401, 402, 403, . . . and, therefore, denoting the number of each type of mechanisms installed as "n" and the number of the module substrates 401, 402, 403, . . . as "N", the number of each type of mechanisms installed n is n=2N and the number of parts of the locking mechanism 10 or the inserting and pulling mechanism 18 is proportional to the number two times as many as the number of module substrates 401, 402, 403, . . . installed. Therefore, this leads to an increase of the cost and, the more the number of parts increases, the poorer the assembling workability becomes.

Japanese Laid-Open Patent Publications Nos. 2001-210977 and 11-274765 do not include any suggestion or any disclosure about the problems concerning the connection between substrates using the connectors as above such as checking of the state of the connection using the connectors is difficult, that the connecting structure is complicated, and that the connection workability is degraded, and also do not disclose any means to solve those problems.

SUMMARY

According to an aspect of the embodiments of the present invention, an apparatus includes a first substrate; a first connector disposed on a top face of the first substrate; a to-be-fixed member disposed on a back face of the first substrate; a second substrate disposed facing the first substrate; a second connector disposed on the second substrate and connected to the first connector; and a fixing module disposed on the second substrate and pivoting a locking arm using a rotating shaft, wherein the to-be-fixed member is pushed by a pushing portion provided at a tip of the locking arm when the locking arm is at a first position.

According to another aspect of the embodiments of the present invention, an apparatus includes a first substrate; a first connector disposed on a top face of the first substrate; a guiding unit disposed on a back face of the first substrate; a second substrate disposed facing the first substrate; a second connector disposed on the second substrate and connected to the first connector; and a fixing module disposed on the second substrate and pivoting a locking arm using a rotating shaft, wherein a detachment preventing portion provided for a tip of the locking arm is positioned immediately above the guiding portion at a first position.

According to further another aspect of the embodiments of the present invention, there is provided amounting structure for pushing a first substrate having a first connector disposed thereon to a second substrate having a second connecter connected to the first connector, wherein the first substrate has a to-be-fixed member disposed on a back face of a face on which the first connector is disposed, wherein the second substrate has a locking arm including pushing portion pushing the first substrate and rotatable between a first position and a second position that is different from the first position, and a fixing module pivoting the locking arm using a rotating shaft, and wherein the to-be-fixed member is pushed by a pushing portion provided for a tip of the locking arm at the first position and is not pushed by the pushing portion at the second position.

According to further another aspect of the embodiments of the present invention, there is provided an inserting and pulling jig for inserting a first substrate having two positioning pins disposed facing each other in a periphery of the first substrate into a second substrate or pulling out the first substrate from the second substrate, wherein the second substrate further includes two fixing modules each having an inserting and pulling guiding groove inserted with a guiding pin of the inserting and pulling jig to insert the first substrate into the second substrate or pull out the first substrate from the second substrate, the inserting and pulling guiding groove having a cross section shape that is same as or approximately an L-shape and the two fixing modules being disposed to hold and sandwiching the first substrate therebetween, wherein the inserting and pulling jig has two board-like members facing each other and formed such that the each board-like members is rotated centering as its rotation axis the guiding pin inserted into the inserting and pulling guiding groove and, thereby, the board-like members push down the locking arm from a first position to a second position, and wherein each of the board-like members has a hooking portion to lift the first substrate hooking the guiding pin and the positioning pins inserted into the inserting and pulling guiding groove.

According to further another aspect of the embodiments of the present invention, a fixing method for fixing a first substrate that has a first connector disposed on a top face of the first substrate, a to-be-fixed member disposed on a back face of the first substrate, and positioning pins disposed facing each other in a periphery of the first substrate, to a second substrate that has a second connector disposed thereon and connected to the first connector, using a fixing module that fixes the first substrate disposed on the second substrate, includes positioning the first substrate relative to the second substrate by inserting the positioning pins into a positioning groove of the fixing module; connecting the first connector to the second connector; and rotating a locking arm pivoted by a rotating shaft to a position at which a pushing portion provided for a tip of the locking arm pushes the to-be-fixed member.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

Other objects, features and advantages of the present invention will become more apparent when referring to the accompanying drawings and the embodiments herein.

BRIEF DESCRIPTION OF DRAWINGS

FIGS. 1A and 1B are diagrams of a conventional connection between substrates using connectors;

FIG. 27 is a diagram of an operation of the inserting and pulling jig;

FIG. 32 is a diagram of an operation of the inserting and pulling jig;

DESCRIPTION OF EMBODIMENTS

Embodiments of the present invention are an apparatus, a mounting structure, an inserting and pulling jig or a fixing method that uses connectors for a connection between substrates. The apparatus or the mounting structure that uses connectors for a connection between substrates is adapted to push a to-be-fixed member on a first substrate using a pushing portion of a locking arm of a fixing module on a second substrate when the first and the second substrates are connected to each other using connectors. The inserting and pulling jig is adapted to insert and pull out such connectors used in the connection. The fixing method is adapted to fix the first and the second substrates using the fixing module.

First Embodiment

Figure 10:
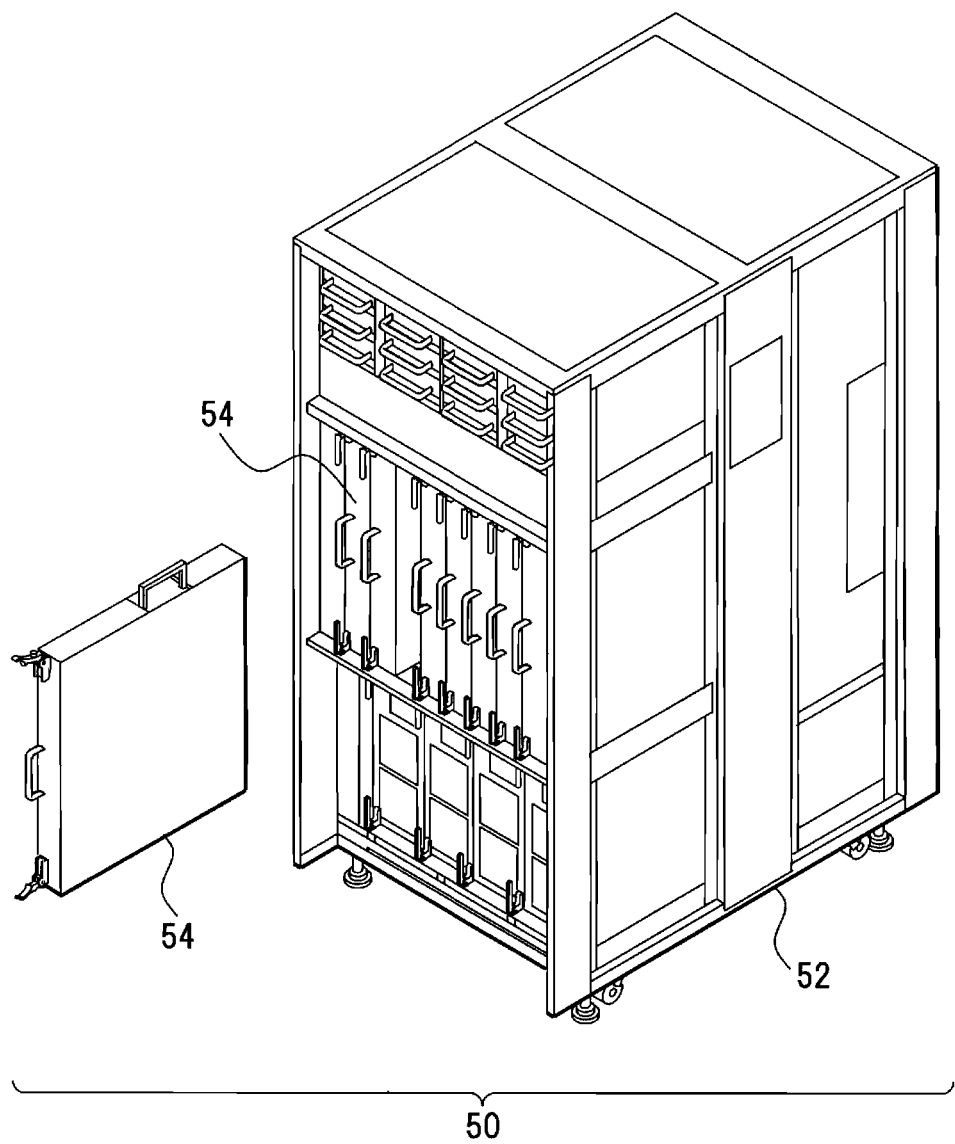
FIG. 10 is a diagram of a server apparatus according to a first embodiment.
Figure 11:
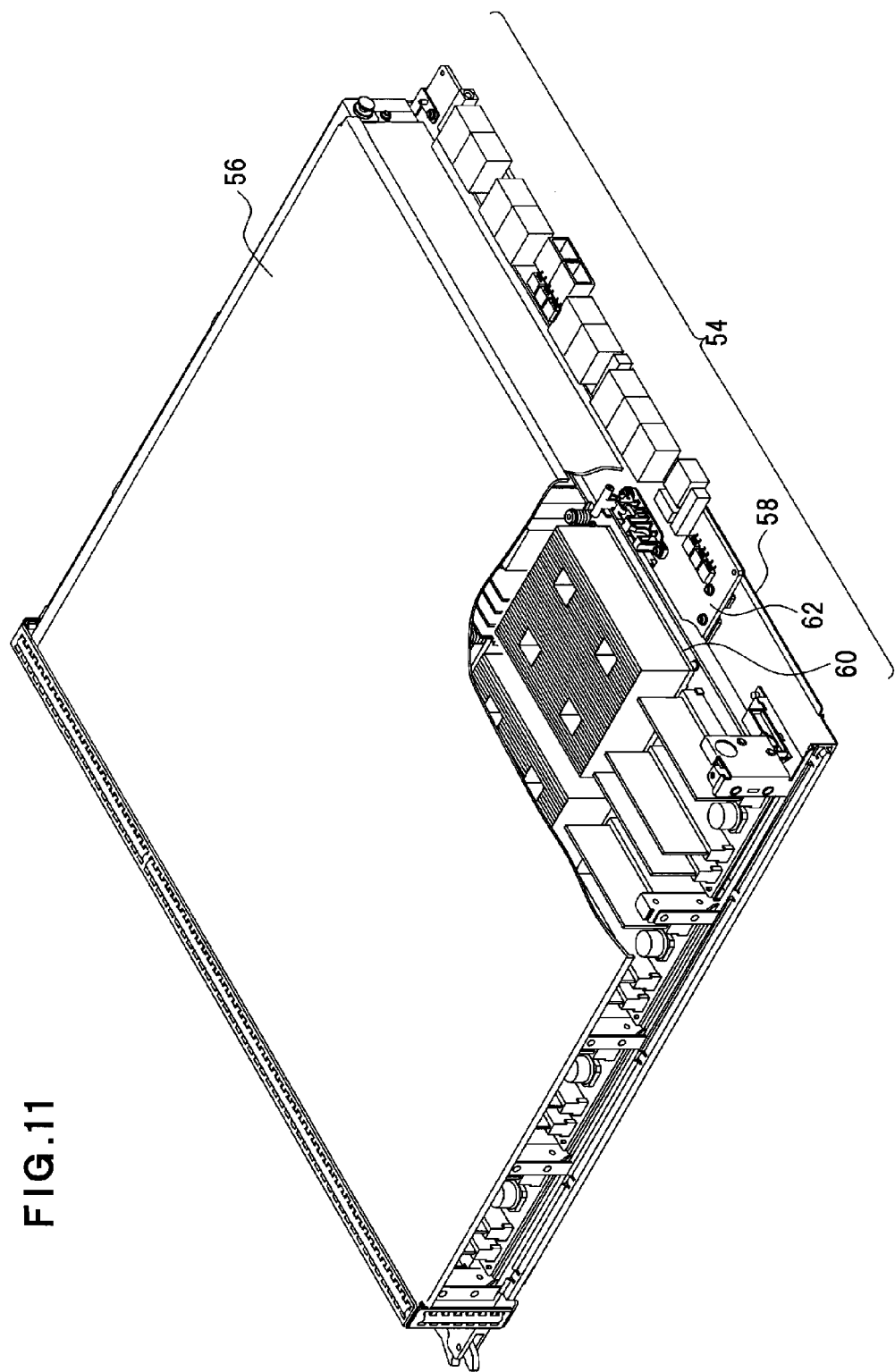
FIG. 11 is a diagram of a server unit.

A first embodiment will be described with reference to FIGS. 10 and 11. FIG. 10 depicts a server apparatus according to the first embodiment. FIG. 11 depicts a server unit that is partially cut out. The configuration depicted is an example and the present invention is not limited to the configuration.

A server apparatus 50 is an example of each of various apparatuses such as an information processing apparatus and an electronic apparatus that use connections using connectors between substrates. As depicted in FIG. 10, a housing 52 of the server apparatus 50 is mounted with a plurality of detachable server units 54.

As depicted in FIG. 11, the server unit 54 includes a unit housing 56, and the unit housing 56 includes a chassis 58, a processor module substrate 60 as a first substrate (hereinafter, "module substrate"), a system board 62 as a second substrate, etc mounted therein. The module substrate 60 is a child substrate and the system board 62 to be mounted with the module substrate 60 is a parent substrate.

Figure 12:
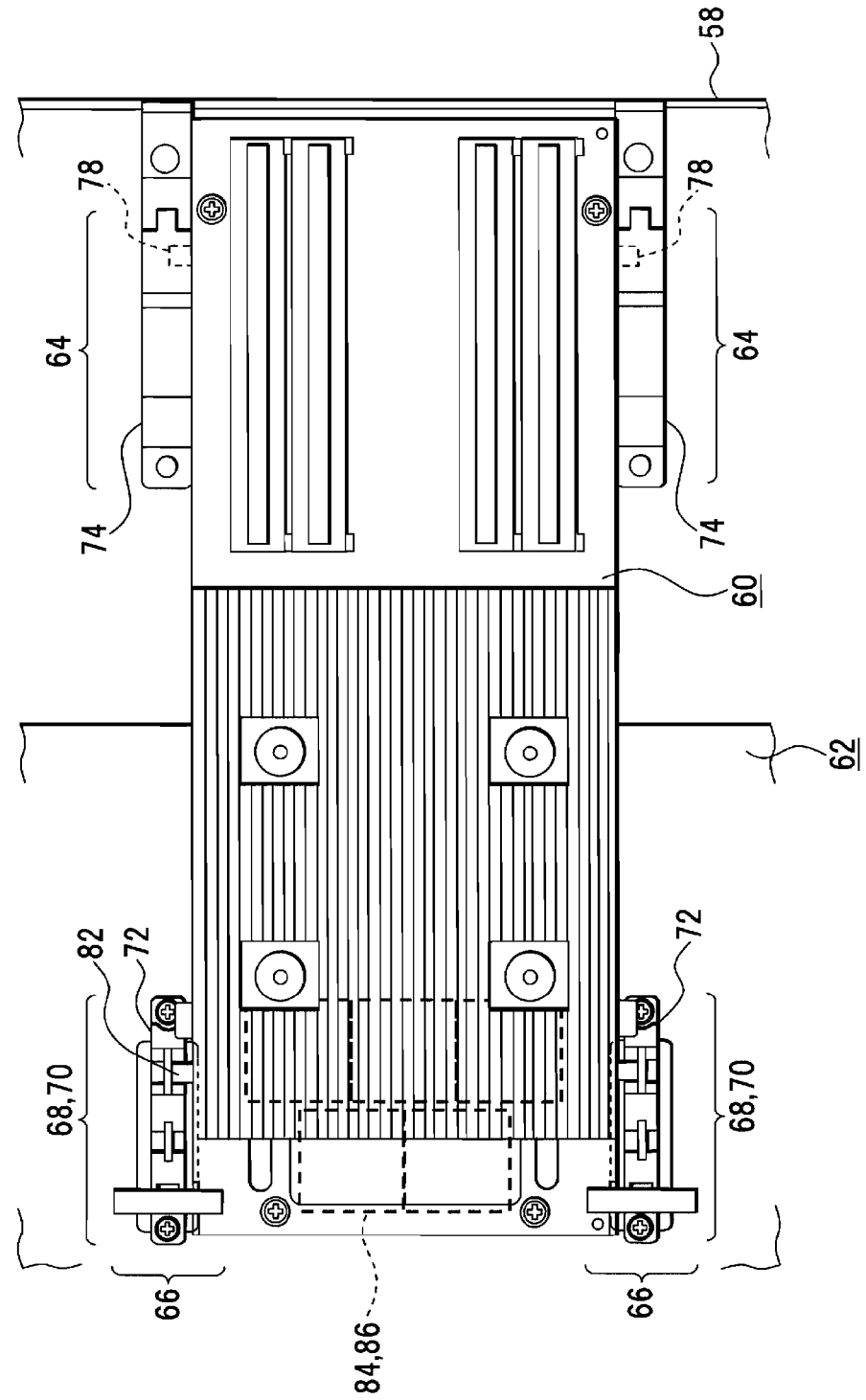
FIG. 12 is a diagram of a system board and a processor module substrate.
Figure 13:
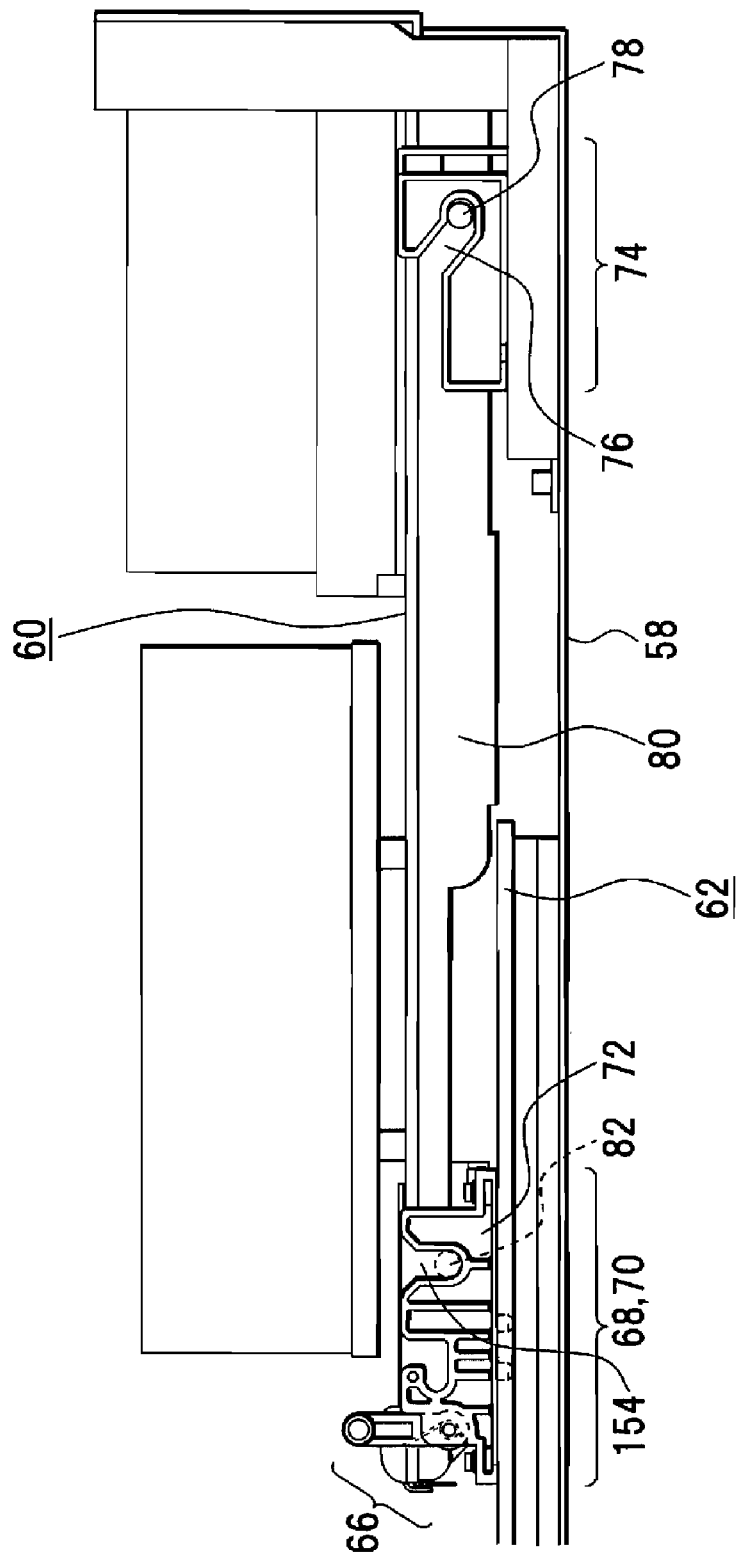
FIG. 13 is a diagram of the system board and the processor module substrate.
Figure 14:
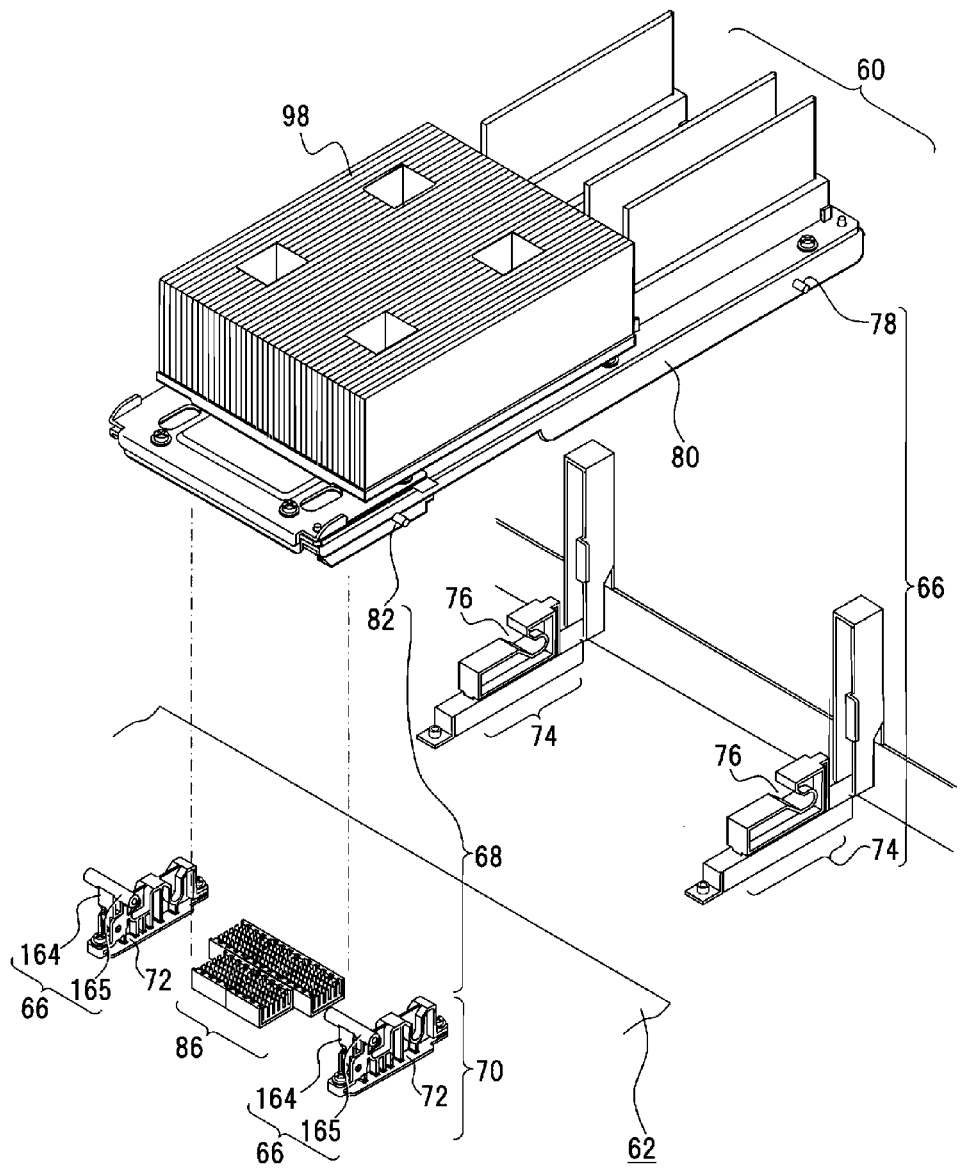
FIG. 14 is an exploded perspective view of a mounting structure of the processor module substrate.
Figure 15:
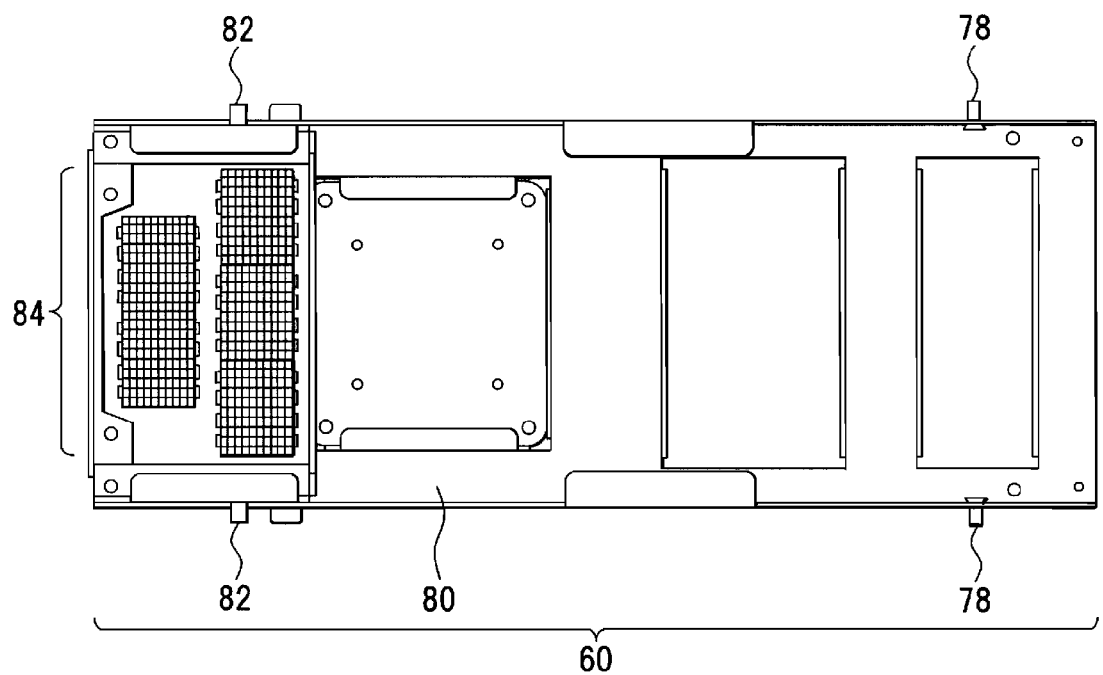
FIG. 15 is a diagram of a downward face of the processor module substrate.
Figure 16:
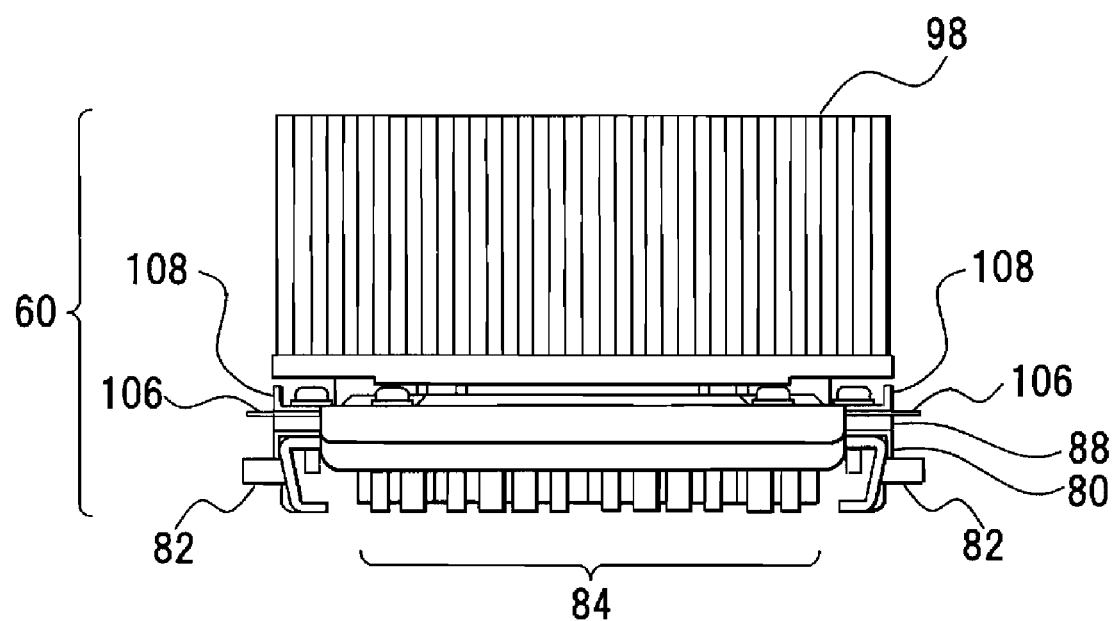
FIG. 16 is a diagram of a back face of the processor module substrate.

A mounting structure of the module substrate will be described with reference to FIGS. 12 to 16. FIG. 12 depicts a portion of the system board and the module substrate. FIG. 13 depicts the module substrate fixed to the system board. FIG. 14 depicts a mounting structure of the module substrate. FIG. 15 depicts atop face of the module substrate. FIG. 16 depicts a back face of the module substrate. The configuration depicted is an example and the present invention is not limited to the configuration. In FIGS. 12 to 16, the same components as those in FIGS. 10 and 11 are given the same reference numerals.

As depicted in FIG. 12, the system board 62 is installed with guiding and locking mechanisms 64, locking mechanisms 66 and positioning mechanisms 68 of the module substrate 60 to be mounted on the system board 62, and fixing modules 72 to be used for inserting and pulling mechanisms 70. The fixing modules 72 are installed on the system board 62 holding the module substrate 60 sandwiching the module substrate 60 therebetween, are guiding units (module guides) to fix the module substrate 60, and are fixing units for the module substrate 60.

The guiding and locking mechanism 64 is a guiding unit that guides the module substrate 60 in mounting thereof, is a positioning unit for positioning, and is also a locking unit that locks an end of the module substrate 60. The system board 62 is installed with a pair of guiding and locking modules 74 being spaced corresponding to the substrate width of the module substrate 60 to be mounted. As depicted in FIG. 13, each of the guiding and locking modules 74 is formed with a guiding groove 76 and a locking pin 78 of the module substrate 60 is inserted in the guiding groove 76 and is positioned. The locking pin 78 is provided for a side face of a supporting frame 80 of the module substrate 60 protruding therefrom.

The locking mechanism 66 is a unit of locking the end of the module substrate 60 and, thereby, locking the module substrate 60 mounted on the system board 62, into a mounted state. The locking mechanism 66 is installed on a side opposite to the guiding and locking mechanism 64. The system board 62 is installed with a pair of the fixing modules 72. The fixing modules 72 are installed being spaced corresponding to the substrate width of the module substrate 60 to be mounted.

Figure 19:
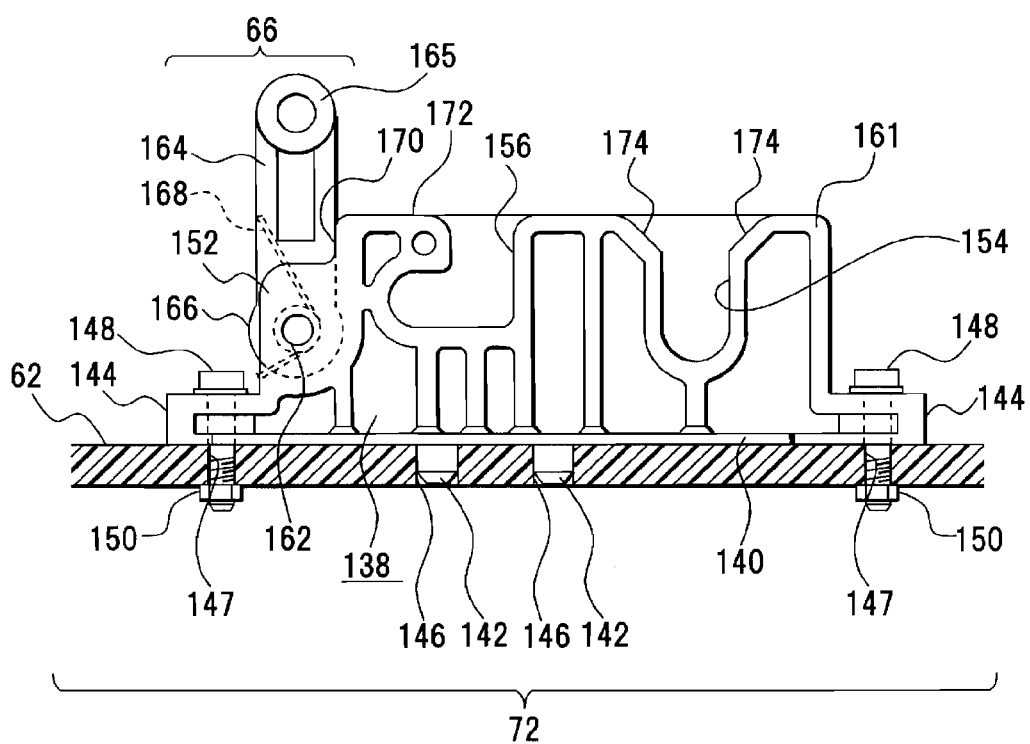
FIG. 19 is a diagram of a fixing module on the system board.

The positioning mechanism 58 is a unit of positioning the module substrate 60 to be mounted on the system board 62 at a position for the connection using the connectors. In the embodiment, the fixing modules 72 are commonly used and, as depicted in FIG. 14, a positioning pin 82 is provided for the supporting frame 80 of the module substrate 60 protruding therefrom and the positioning pin 82 is inserted into a first positioning groove 154 of the fixing module 72 (FIGS. 13 and 19). Thereby, the module substrate 60 is positioned at a position for its mounting (a position for the module substrate to be fitted with the connectors therebetween).

Figure 22:
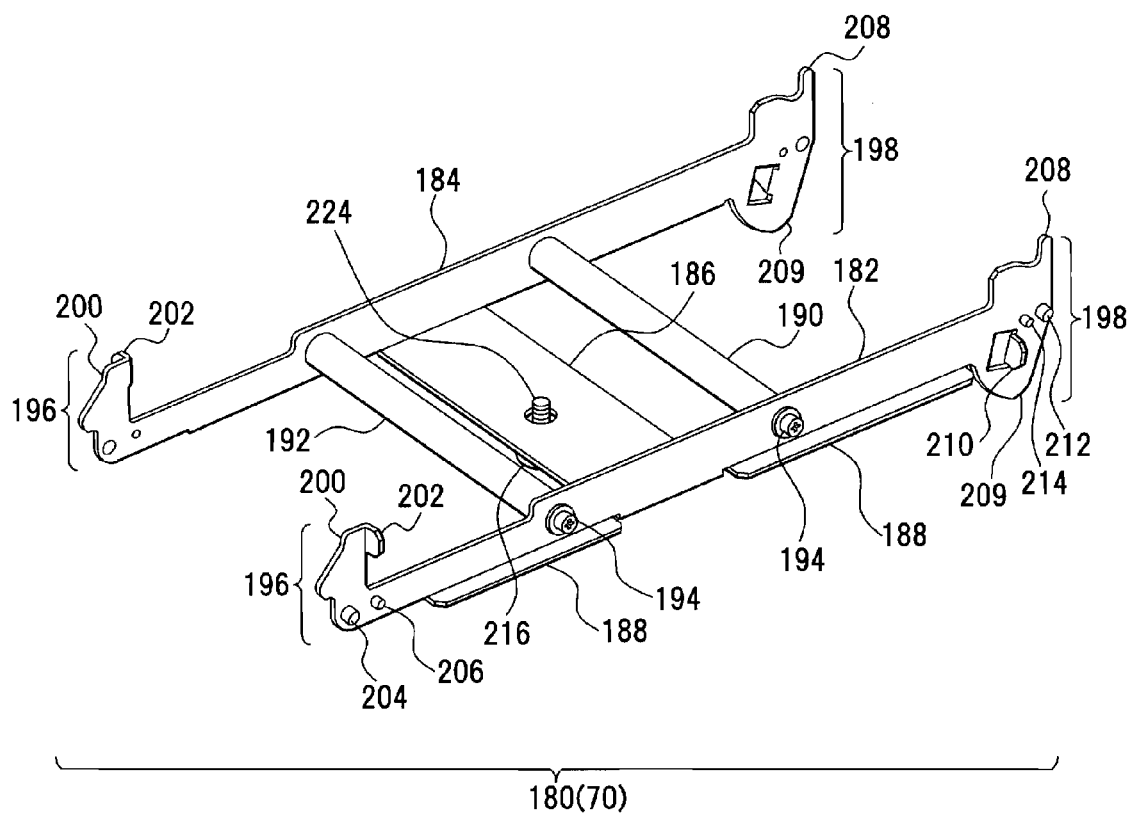
FIG. 22 is a perspective view of an inserting and pulling jig.

The inserting and pulling mechanism 70 is a unit of attaching and detaching a first connector 84 on the top side of the module substrate 60 (FIGS. 15 and 16) and a second connector 86 on the top side of the system board 62 (FIG. 14) to/from each other, and includes the fixing module 72 and an inserting and pulling jig 180 (FIG. 22).

According to the above configuration, the locking pin 78 of the module substrate 60 is inserted into the guiding groove 76 of the guiding and locking module 74 and, thereby, the module substrate 60 is positioned and the module substrate 60 is positioned at the position for its mounting by the positioning mechanism 68. The connectors 84 and 86 are fitted with each other and, thereby, the module substrate 60 mounted on the system board 62 is locked by the locking mechanism 66 at the position for its mounting.

The inserting and pulling mechanism 70 can insert the module substrate 60 into the system board 62 and can pull out the module substrate 60 from the system board 62 using the inserting and pulling jig 180 installed to the fixing module 72 (FIG. 22).

Figure 17:
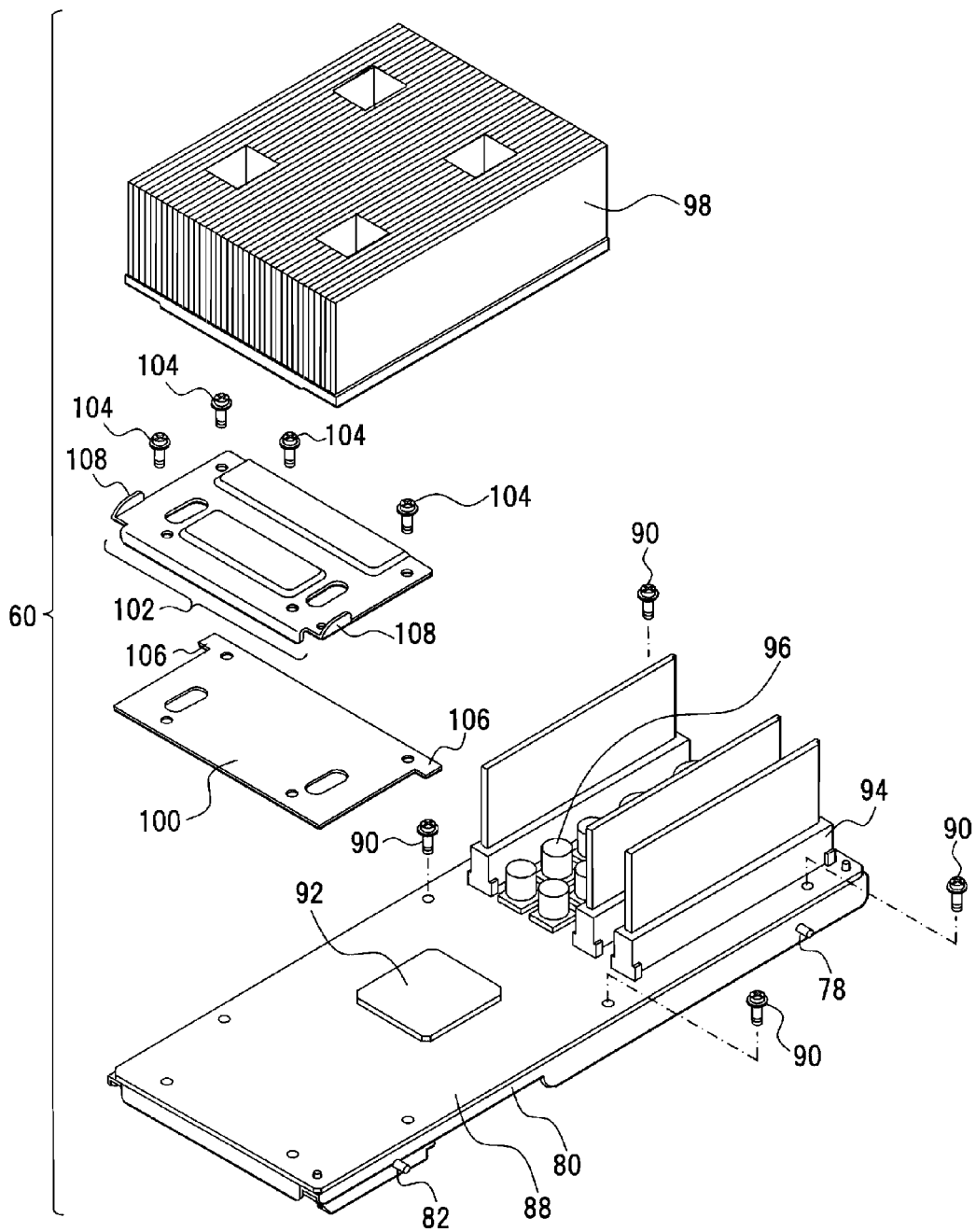
FIG. 17 is an exploded perspective view of the processor module substrate.

The module substrate will be described with reference to FIG. 17. FIG. 17 is an exploded perspective view of the module substrate. The configuration depicted is an example and the present invention is not limited to the configuration. In FIG. 17, the same components as those in FIGS. 11 to 16 are given the same reference numerals.

On the module substrate 60, the supporting frame 80 and a substrate unit 88 are fixed by a plurality of fixing screws 90 and the locking pin 78 and the positioning pin 82 are provided for the side face of the supporting frame 80 protruding therefrom. The substrate unit 88 is mounted with: a processor 92; mechanism parts such as a plurality of connectors 94; and electronic parts 96 such as capacitors, and is installed with a heat sink 98 covering the processor 92. An insulating sheet 100 is installed at a position adjacent to the processor 92. On the top face of the insulating sheet 100, a locking plate 102 that is a to-be-fixed member of the locking mechanism 66 (FIG. 14) is superimposed. The locking plate 102 and the insulating sheet 100 are fixed to the supporting frame 80 by a plurality of fixing screws 104 that penetrate the substrate unit 88. The locking plate 102 is, for example, an L-shaped metal plate.

The insulating sheet 100 is substantially rectangular and has a side provided with protecting pieces 106 protruding therefrom as an interference preventing member. Each of the sides of the locking plate 102 is formed with a locking guide 108 as a guiding portion that guides a locking bar 165 (FIGS. 19 and 20) on a locking arm 164 of the locking mechanism 66.

Figure 18:
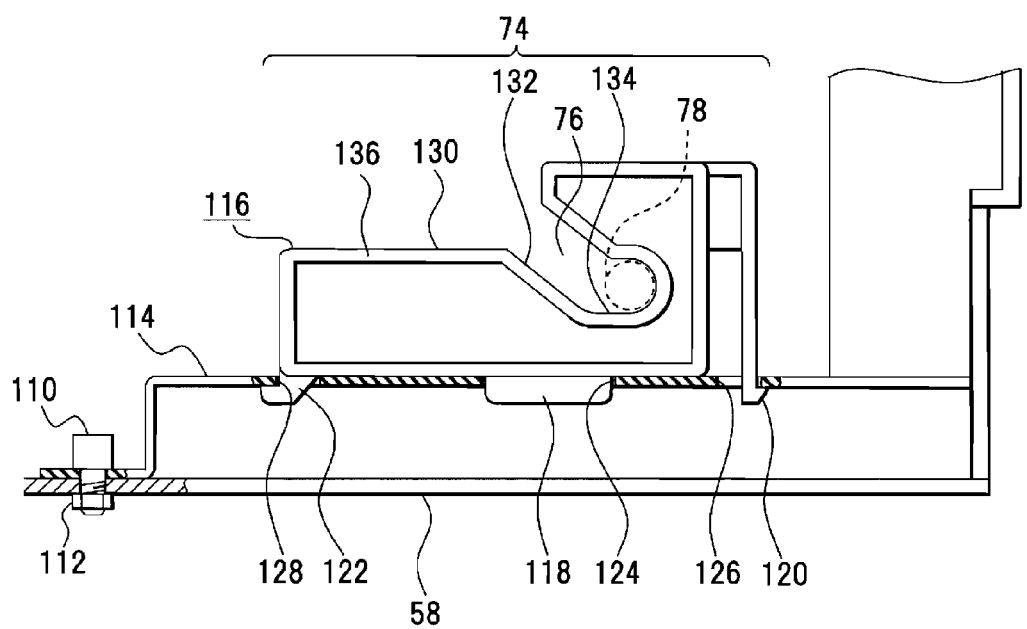
FIG. 18 is a diagram of a guiding and locking module on the system board.

The guiding and locking module 74 will be described with reference to FIG. 18. FIG. 18 depicts the guiding and locking module and the state of its attachment. The configuration depicted is an example and the present invention is not limited to the configuration. In FIG. 18, the same components as those in FIGS. 11 to 17 are given the same reference numerals.

As depicted in FIG. 18, the guiding and locking module 74 is installed on a fixing frame 114 that is fixed to the chassis 58 that supports the system board 62 by, for example, a vis (screw) 110 and a nut 112 as fixing units. The guiding and locking module 74 is a molded body of a synthetic resin and includes a main body 116. The downward face of the main body 116 is formed with a positioning protrusion 118 and fixing pieces 120 and 122. The positioning protrusion 118 is inserted into a positioning hole 124 of a fixing frame 114 and is positioned, and the fixing pieces 120 and 122 are inserted into fixing holes 126 and 128 of the fixing frame 114 and, thereby, the main body 116 is fixed to the top face of the fixing frame 114 and is provided being standing thereon.

The main body 116 is formed with a placement portion 130 on which the locking pin 78 is placed, at a point closer to an entrance of the guiding groove 76 that guides the locking pin 78. The guiding groove 76 is formed with an inclined guiding portion 132 and a positioning portion 134 using a standing wall 136. The inclined guiding portion 132 is a unit of guiding the locking pin 78 to the positioning portion 134 by sliding the locking pin 78.

Figure 20:
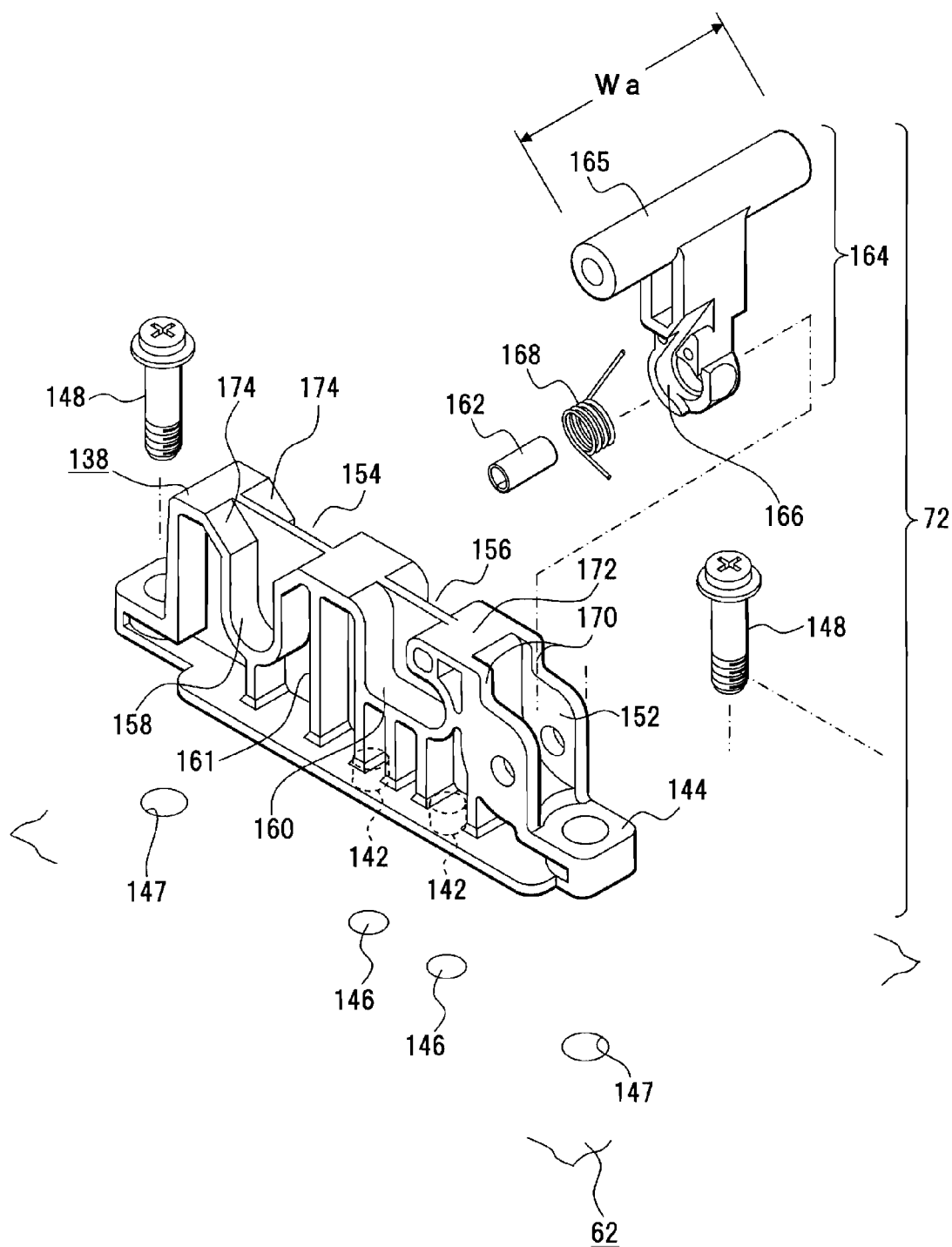
FIG. 20 is an exploded perspective view of the fixing module.
Figure 21A:
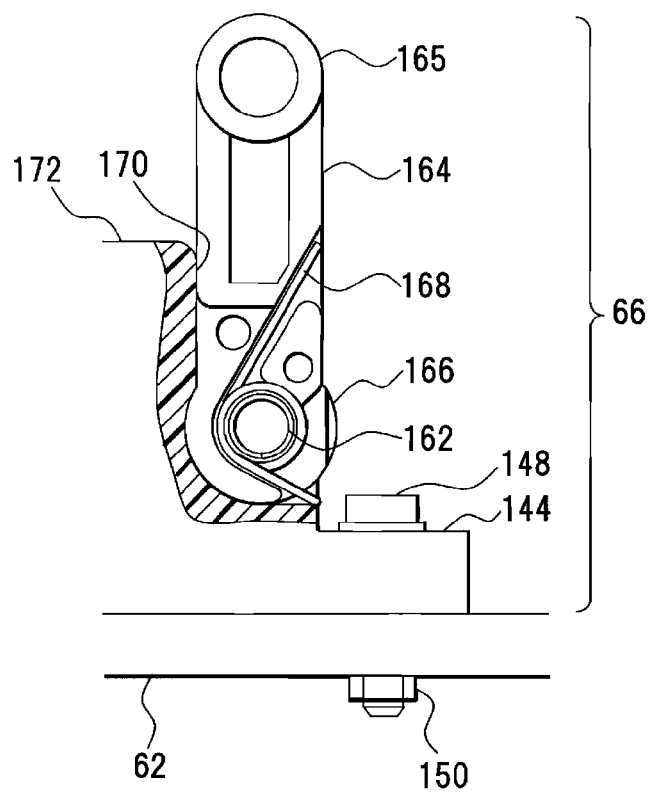
FIGS. 21A and 21B are diagrams of positions of a locking arm rotated of a locking mechanism for its rotation.
Figure 21B:
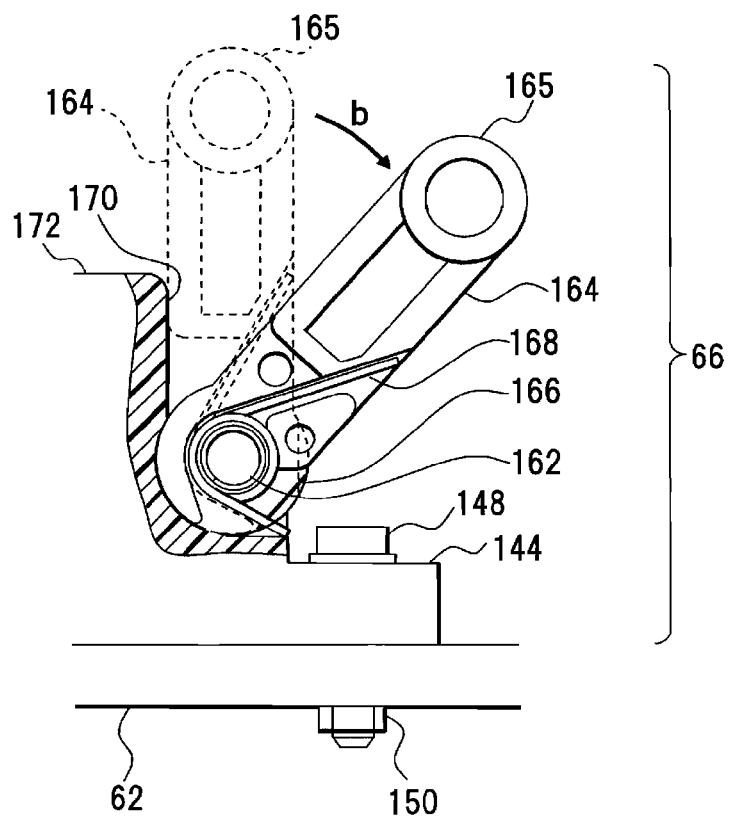

The locking mechanism 66 and the fixing module 72 will be described with reference to FIGS. 19 to 21. FIG. 19 depicts the fixing module and the state of its attachment. FIG. 20 is an exploded perspective view of the fixing module. FIGS. 21A and 21B depict an operation of the locking mechanism. The configuration depicted is an example and the present invention is not limited to the configuration. In FIGS. 19 to 21, the same components as those in FIGS. 11 to 18 are given the same reference numerals.

The fixing module 72 includes, for example, a main body 138 formed by synthetic resin molding. The main body 138 is formed with a seat portion 140 that has a flat downward face to be placed on the system board 62. The seat portion 140 is formed with a plurality of positioning protrusions 142 and fixing portions 144. The main body 138 is positioned by inserting each of the positioning protrusions 142 into each positioning hole 146 of the system board 62, and is fixed to the system board 62 by penetrating a fixing screw 148 from each of the fixing portions 144 through each of fixing holes 147 of the system board 62 and using each of nuts 150.

The main body 138 is formed with a bearing portion 152. A first positioning groove 154 and a first inserting and pulling guiding groove 156 are formed on one face of the main body 138 and a second positioning groove 158 and a second inserting and pulling guiding groove 160 are formed on the other face of the main body 138 (FIG. 20) by a standing wall 161.

A rotating shaft 162 is attached to the bearing portion 152 and the rotating shaft 162 is inserted into a bearing portion 166 of the locking arm 164 and, thereby, the locking arm 164 is pivoted. A coil spring 168 is attached to the rotating shaft 162. The coil spring 168 has one end hooked on the main body 138 and the other end hooked on the locking arm 164 and, thereby, the coil spring is maintained in its compressed state. The main body 138 is formed with a stopper portion 170 that obstructs the rotation of the locking arm 164. A stopper face portion 172 that forms a flat face is formed above the stopper portion 170. The stopper face portion 172 is a part of hooking stopper portions 202 and 210 of the inserting and pulling jig 180 (FIG. 22).

Figure 36:
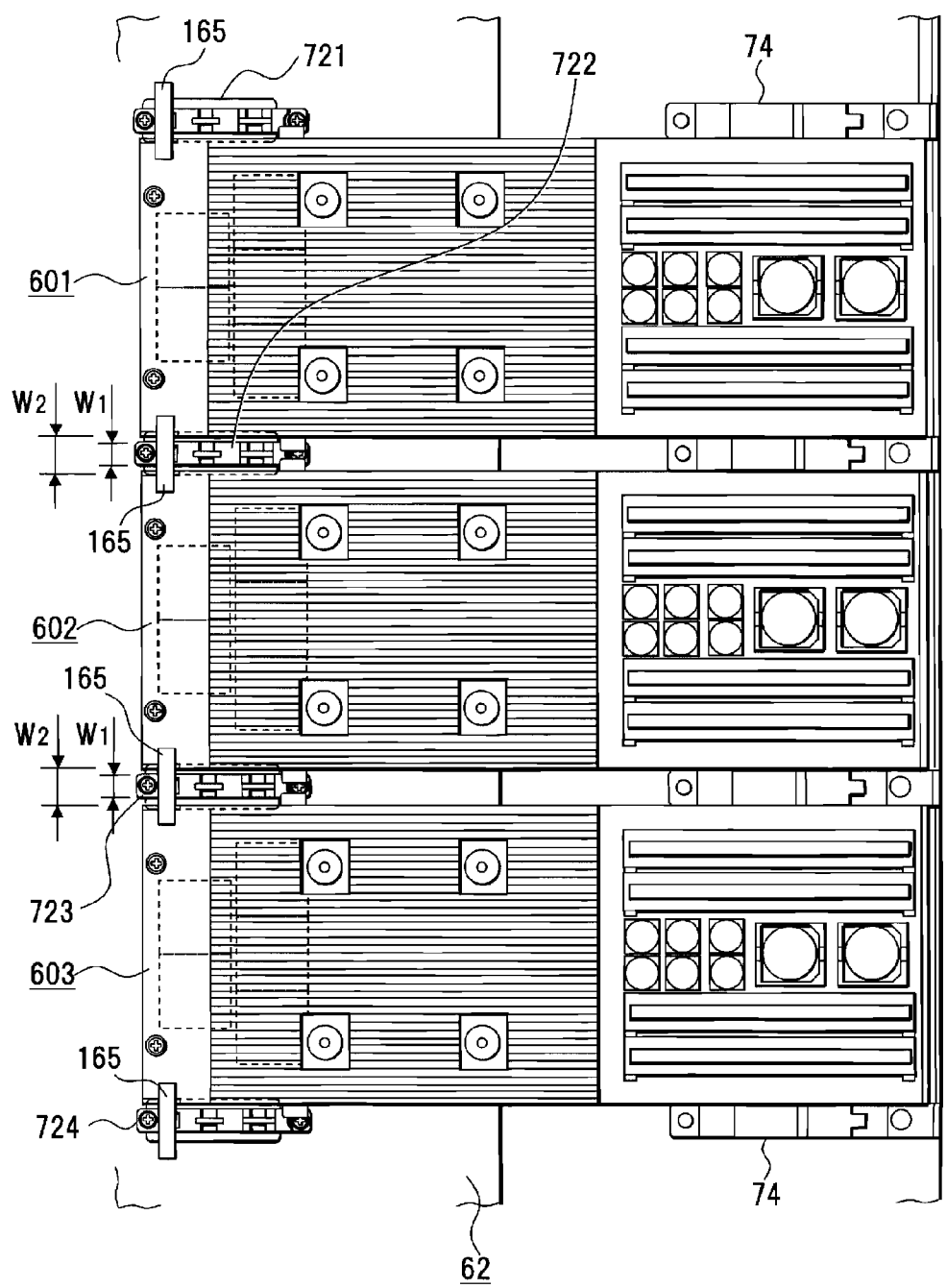
FIG. 36 is a diagram of an apparatus and a mounting structure according to a second embodiment.

The locking arm 164 is formed with the locking bar 165 in a direction of the thickness of the fixing module 72, that is a pushing portion having a shape same as or a substantial T-shape, that is a locking unit of obstructing the release of the connection using the connectors of the module substrate 60, that is a detachment preventing unit of preventing detachment of the module substrate 60 from the system board 62, and that is an identifying unit of externally identifying whether the module substrate 60 is in a normal connection state (connected using the connectors). The locking bar 165 is a column and its circumferential face is a curved face. Therefore, a move of the locking plate 102 (FIG. 17) to the locking guide 108 becomes easy. Denoting the width of the locking bar 165 as "Wa" (FIG. 20) and a spacing for installation of the module substrates 60 installed adjacent to each other as "Wx", the relation between Wa and Wx is Wa>Wx and Wa is set to be a length that allows the locking bar 165 to be installed at least astride each locking guide 108 of each of the locking plates 102 (FIG. 17) adjacent to each other (FIG. 36).

The positioning pin 82 (FIG. 17) of the module substrate 60 is inserted into each of the positioning grooves 154 and 158. To facilitate this insertion, a tapered portion 174 is formed in a groove entrance portion. The inserting and pulling guiding grooves 156 and 160 are parts of being inserted with guiding pins 204, 206, 212 and 214 (FIG. 22) of the inserting and pulling jig 180 and supporting the inserting and pulling jig 180, and each have a cross section that is a groove shape same as or a substantial L-shape.

As depicted in FIG. 21A, the coil spring 168 of the locking mechanism 66 is maintained in its compressed state and, therefore, a rotary force acts on the locking arm 164 due to the restoring force of the coil spring 168 and the rotation of the locking arm 164 is obstructed by the stopper portion 170 and is maintained accordingly. This abutting position is a position at which the module substrate 60 is locked.

As depicted in FIG. 21B, the locking arm 164 can be rotated centering the rotating shaft 162 in a direction indicated by an arrow "b" from the locking position when a force is applied to the locking arm 164 in a direction opposing the restoring force of the coil spring 168 (arrow b). FIG. 21B depicts a position of the locking arm 164 that is unlocked.

Figure 23:
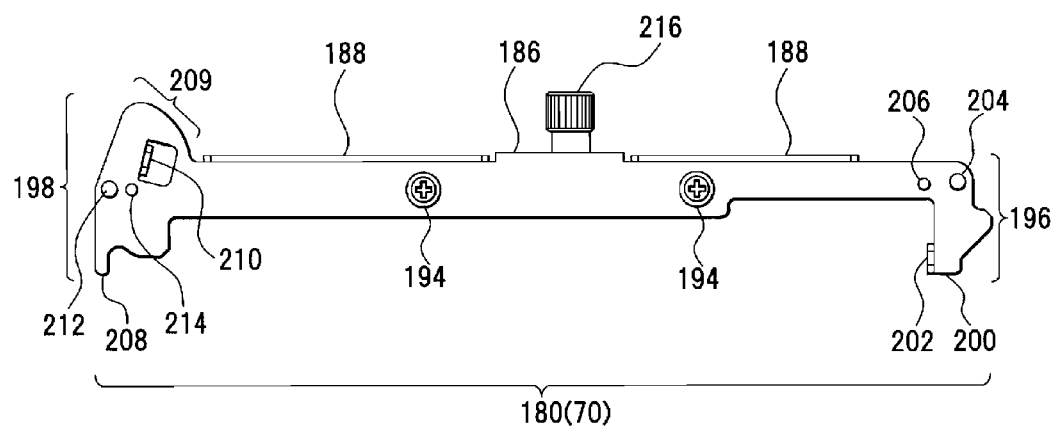
FIG. 23 is a side view of the inserting and pulling jig.
Figure 24A:
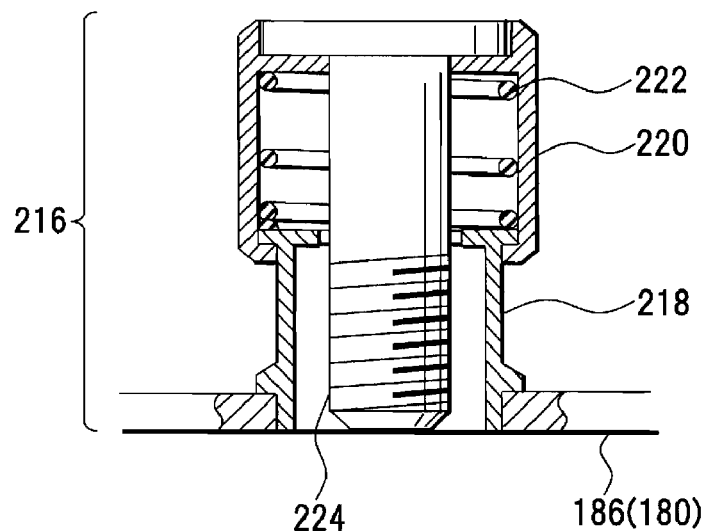
FIGS. 24A and 24B are diagrams of a fixing screw portion of the inserting and pulling jig and its operation.
Figure 24B:
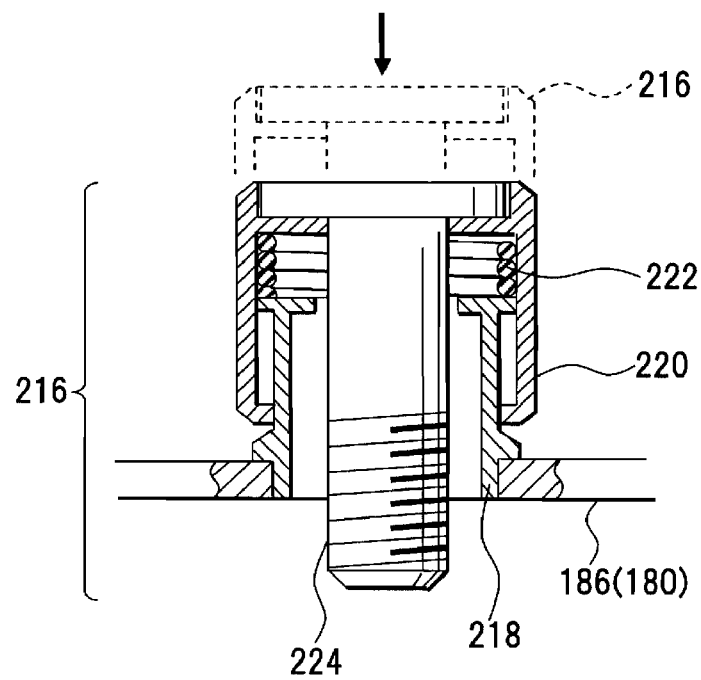

The inserting and pulling jig of the inserting and pulling mechanism 70 will be described with reference to FIGS. 22 to 24B. FIG. 22 is a perspective view of the inserting and pulling jig. FIG. 23 is a side view of the inserting and pulling jig. FIGS. 24A and 24B depict a fixing portion of the inserting and pulling jig and its operation. The configuration depicted is an example and the present invention is not limited to the configuration. In FIGS. 22 to 24B, the same components as those in FIGS. 11 to 21B are given the same reference numerals.

As depicted in FIGS. 22 and 23, the inserting and pulling jig 180 used for an operation of the inserting and pulling mechanism 70 includes a pair of inserting and pulling arms 182 and 184 that face each other. The inserting and pulling arms 182 and 184 are bridged to join each other by a bridging portion 186 therebetween, and each have a C-shaped cross section. The inserting and pulling arms 182 and 184 and the bridging portion 186 are each formed of a metal plate such as a stainless plate. The inserting and pulling arms 182 and 184 configure two board-like members. The inserting and pulling arms 182 and 184 are formed with a plurality of reinforcing portions 188 to prevent their bending caused by a rotation moment. Each of the reinforcing portions 188 has an L-shaped cross section formed by bending a portion of each of the inserting and pulling arms 182 and 184 that is formed to have a larger width.

Between the inserting and pulling arms 182 and 184, bridging shafts 190 and 192 are attached sandwiching the bridging portion 186. The bridging shafts 190 and 192 are configured by metal bars such as stainless steel bars, and are fixed to the inserting and pulling arms 182 and 184 by fixing screws 194.

Each of the inserting and pulling arms 182 and 184 has one end formed with an inserting portion 196 and the other end formed with a pulling portion 198. The inserting portion 196 has a substantial L-shape relative to each of the inserting and pulling arms 182 and 184, is formed with a pin pushing portion 200 that pushes down the positioning pin 82 in a direction for each of the connectors 84 and 86 (FIGS. 14 and 15) to be attached, and is formed with a stopper portion 202 by being bent in a direction opposite to the other inserting portion 196. The inserting portion 196 is formed with a first and a second guiding pins 204 and 206 as inserting pins to be inserted into the inserting and pulling guiding grooves 156 and 160. The guiding pin 204 on the tip of each of the inserting and pulling arms 182 and 184 has a large diameter and the other guiding pin 206 has a small diameter.

The pulling portion 198 has a substantial T-shape relative to each of the inserting and pulling arms 182 and 184, and is formed with a pin-lifting pawl 208 as a hooking portion, a locking releasing portion 209, the stopper portion 210 and a third and a fourth guiding pins 212 and 214 as inserting pins. The pin-lifting pawl 208 configures a pin-lifting portion that lifts the positioning pin 82 in a direction for the connectors 84 and 86 (FIGS. 14 and 15) to be released. The locking releasing portion 209 is a curved face portion formed in the pulling portion 198, and is a part of being abutted on the locking bar 165 of the locking arm 164 and rotating the locking arm 164 to a position to release the locking. The stopper portion 210 is a part of obstructing the rotation of the inserting and pulling jig 180 by being abutted on the stopper face portion 172 (FIG. 20) of the fixing module 72, and is formed by cutting and raising the material of the pulling portion 198 in a direction opposite to the direction toward the inserting and pulling arms 182 and 184. The guiding pin 212 is inserted into the inserting and pulling guiding groove 156 or 160 and forms a rotation axis or a fulcrum of a lever. The guiding pin 214 is a pulling part of being abutted on the stopper face portion 172 of the fixing module 72 and causing the inserting and pulling jig 180 to be hooked on the fixing module 72 in cooperation with the guiding pin 212. The guiding pin 212 on the tip of each of the inserting and pulling arms 182 and 184 has a large diameter and the other guiding pin 214 has a small diameter.

As depicted in FIG. 24A, the bridging portion 186 is attached with a fixing screw 216 that is movable forward and backward to fix the inserting and pulling jig 180 at a position for storage. The fixing screw 216 is attached being movable forward and backward, to a guiding cylinder 218 fixed to the bridging portion 186. A coil spring 222 is accommodated between the guiding cylinder 218 and a knob 220 of the fixing screw 216. As depicted in FIG. 24B, when the fixing screw 216 is pushed toward the bridging portion 186 using the knob 220: the coil spring 222 is compressed; the knob 220 is guided into the guiding cylinder 218; and a screw portion 224 is protruded from the bridging portion 186. In this state, when the knob 220 is rotated, the screw portion 224 can be attached to a screw portion of the counterpart for the attachment.

Figure 25:
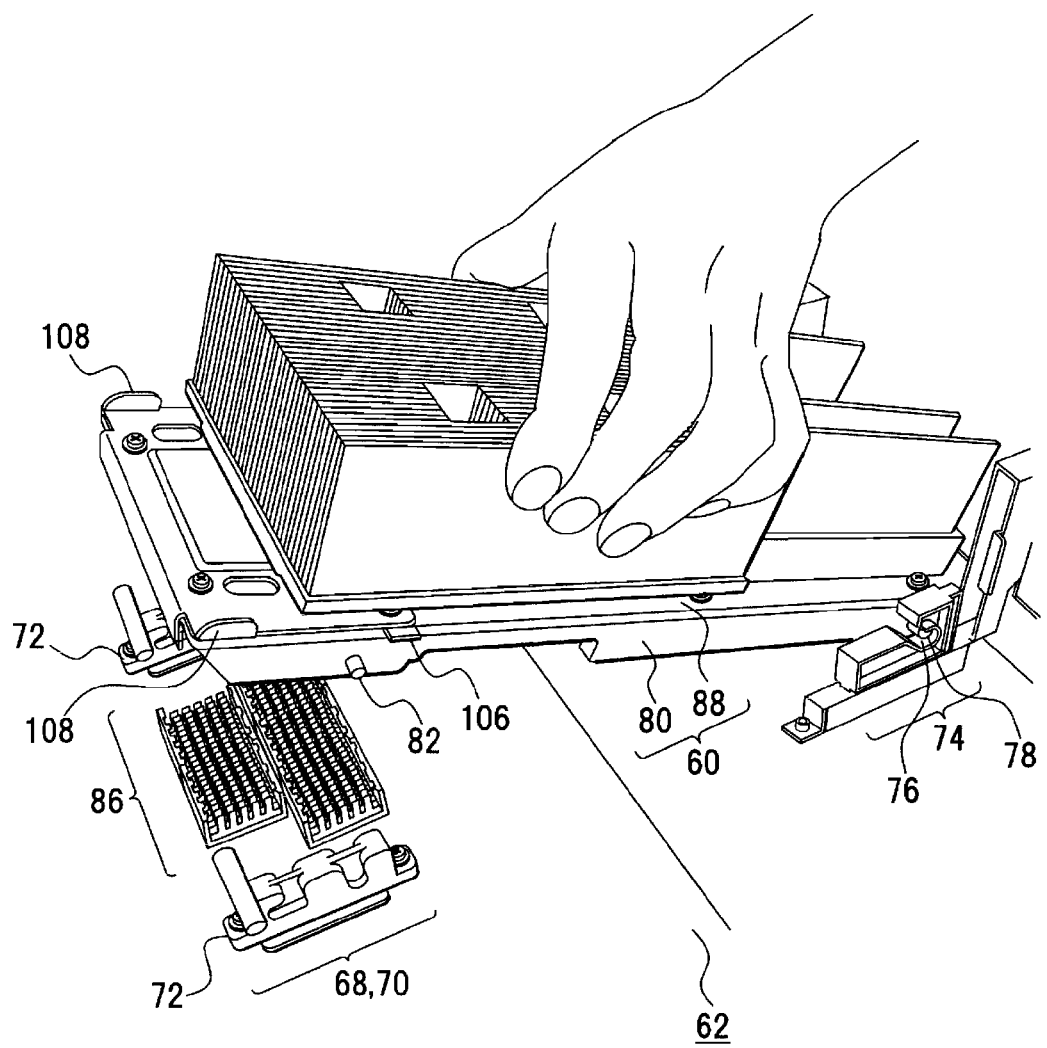
FIG. 25 is a diagram of attachment of the processor module substrate.
Figure 26:
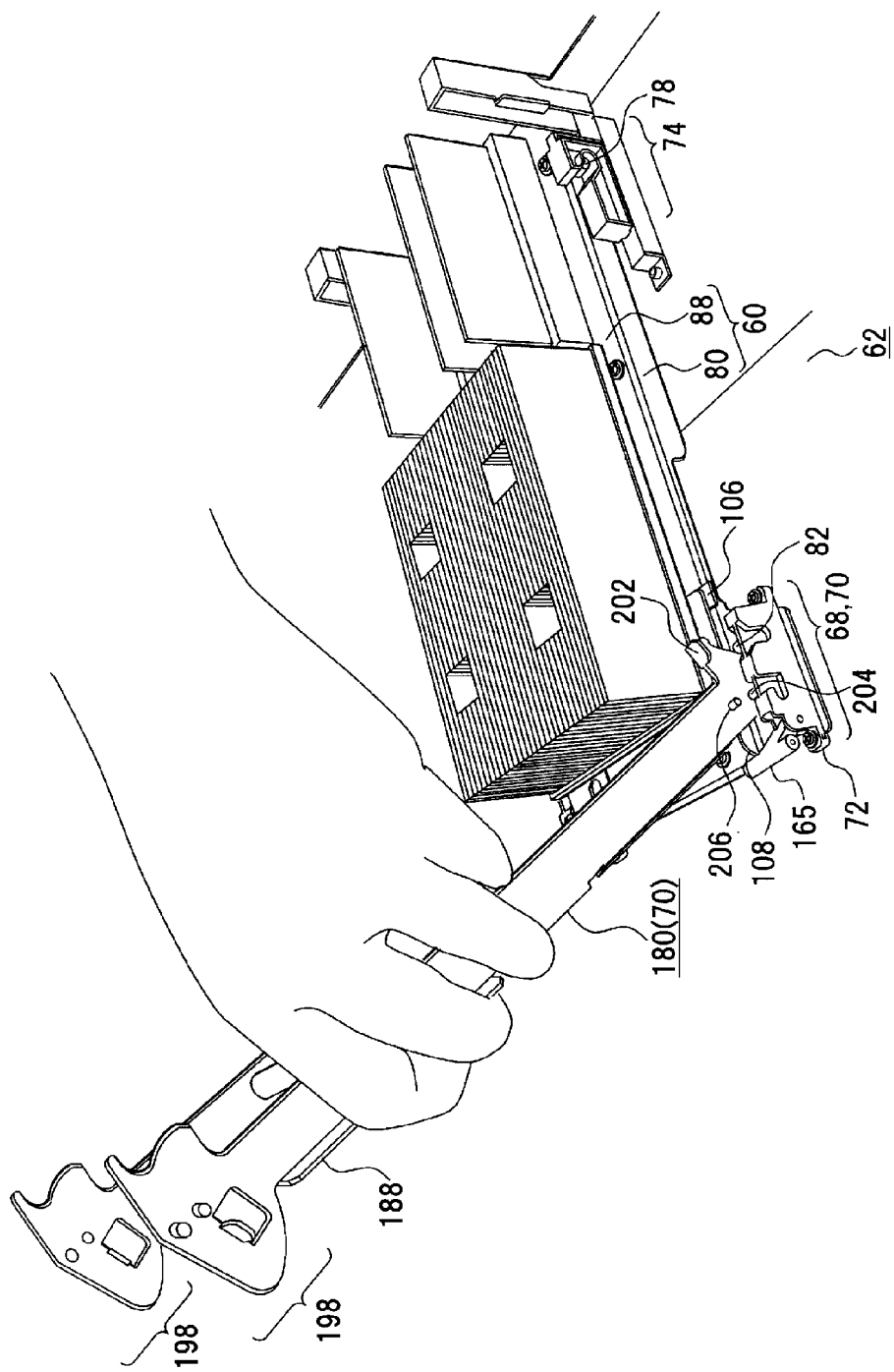
FIG. 26 is a diagram of attachment of the inserting and pulling jig.
Figure 28A:
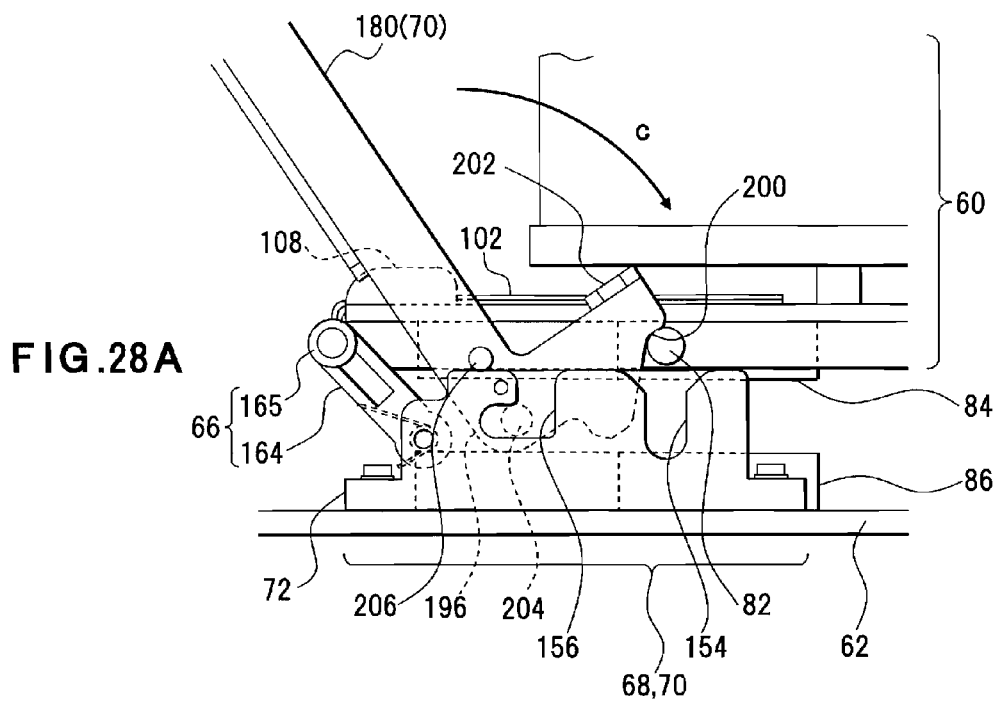
FIGS. 28A and 28B are diagrams of a locking operation and a connection using the connectors by the inserting and pulling jig.
Figure 28B:
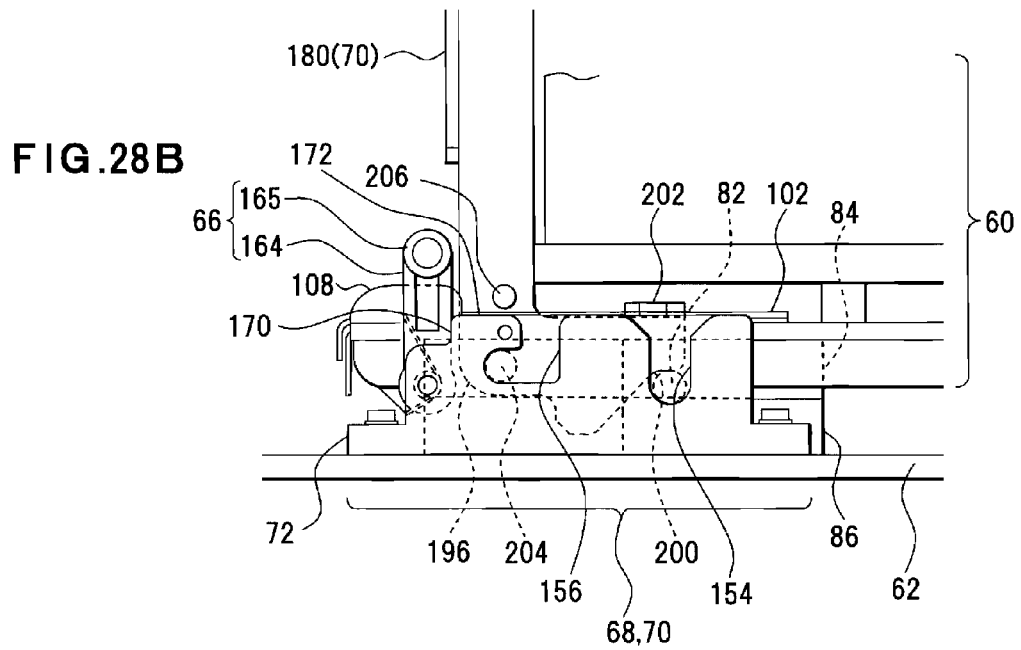
Figure 29A:
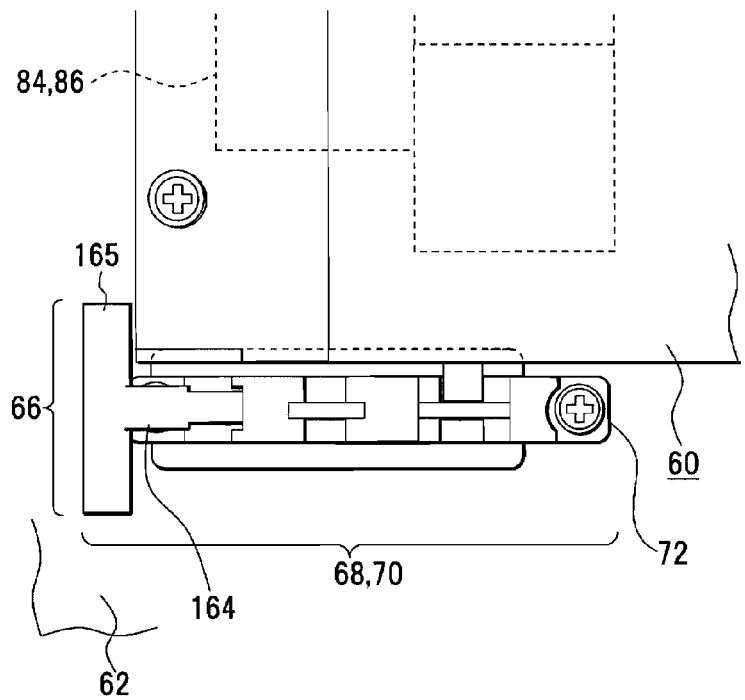
FIGS. 29A and 29B are diagrams of a position of the locking arm before its locking.
Figure 29B:
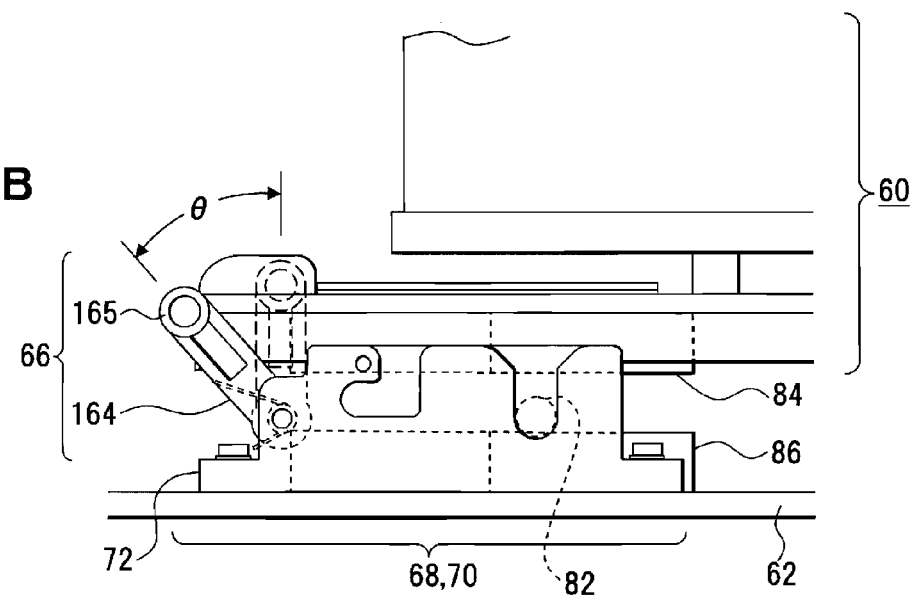
Figure 30A:
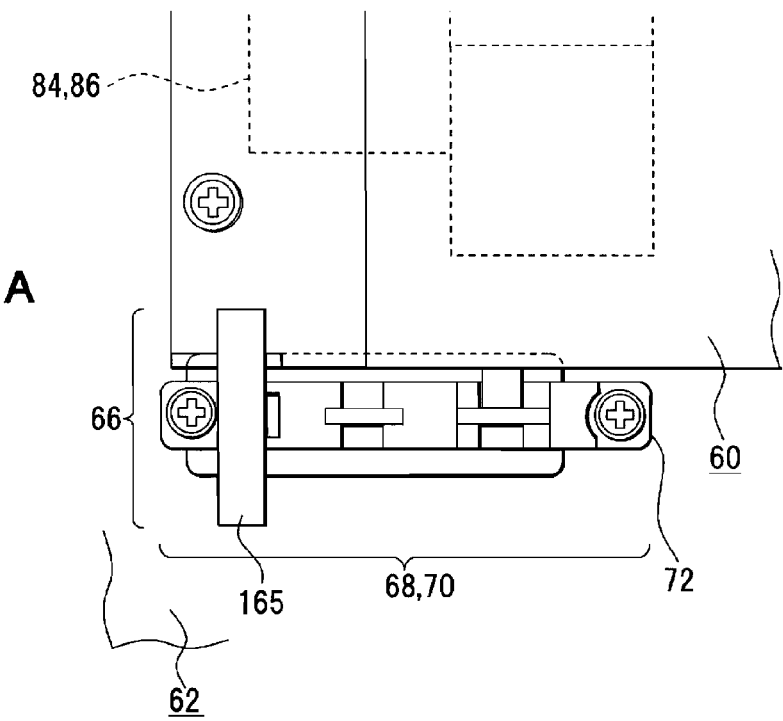
FIGS. 30A and 30B are diagrams of a position of the locking arm after its locking.
Figure 30B:
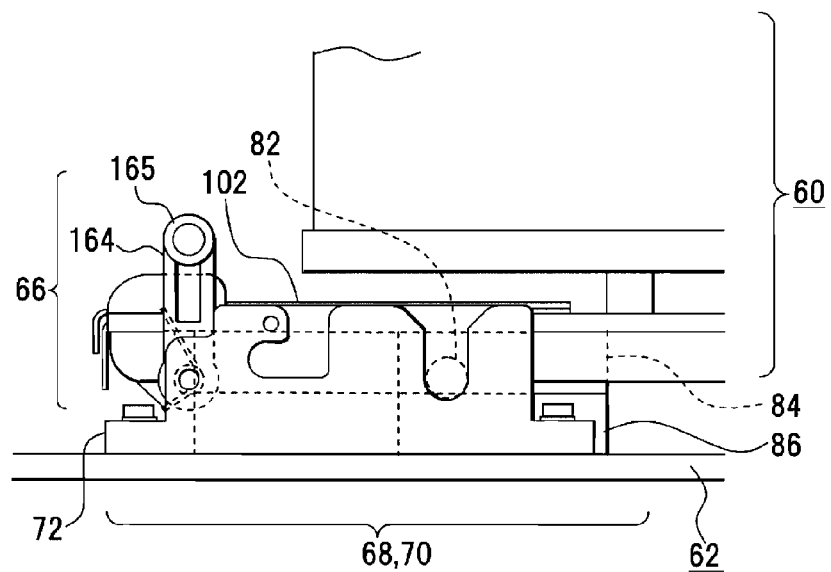

A fixing method of the module substrate 60 will be described with reference to FIGS. 25 to 30B. FIG. 25 depicts insertion of the module substrate into the guiding and locking module. FIG. 26 depicts installation of the inserting and pulling jig. FIG. 27 depicts an operation of the inserting and pulling jig. FIGS. 28A and 28B depict an action of the locking arm in response to the operation of the inserting and pulling jig. FIGS. 29A and 29B depict the module substrate before its locking. FIGS. 30A and 30B depict the module substrate after its locking. In FIGS. 25 to 30B, the same components as those in FIGS. 10 to 24B are given the same reference numerals.

The fixing method of the module substrate 60 includes A) a process of positioning the module substrate, B) a process of attaching the inserting and pulling jig, C) a process of connecting and locking the connectors and D) a process of detaching the inserting and pulling jig.

A) Process of Positioning Module Substrate

As depicted in FIG. 25, the locking pin 78 of the module substrate 60 is inserted into the guiding groove 76 of the guiding and locking module 74 fixed on the chassis 58 that supports the system board 62, and an end of the module substrate 60 is positioned and locked. The positioning pin 82 of the module substrate 60 is inserted into the positioning groove 154 or 158 (FIG. 20) of the fixing module 72 and, thereby, the module substrate 60 is positioned. The connector 84 (FIG. 15) of the module substrate 60 is installed to the connector 86 of the system board 62 being not connected to the connector 86.

B) Process of Attaching Inserting and Pulling Jig

As depicted in FIG. 26, on the module substrate 60 with which the connectors 84 and 86 are maintained to be not connected to each other, the guiding pins 204 and 206 of the inserting portion 196 of the inserting and pulling jig 180 are inserted into the inserting and pulling guiding grooves 156 and 160 (FIG. 20) of each fixing module 72 and, thereby, the inserting and pulling jig 180 is attached to the fixing module 72.

C) Process of Connecting and Locking Connectors

As depicted in FIG. 27, when the inserting and pulling jig 180 installed to the fixing module 72 is rotated centering the guiding pin 204 as its rotation axis in a direction indicated by an arrow "c", the connector 84 (FIG. 15) of the module substrate 60 is pushed against the connector 86 (FIG. 14) of the system board 62 and, thereby, is connected to the connector 86.

As depicted in FIG. 28A, before the rotation of the inserting and pulling jig 180, the connectors 84 and 86 are not connected to each other and the locking arm 164 of the locking mechanism 66 is placed on an end of the module substrate 60, that is, being not locked.

When the inserting and pulling jig 180 is rotated in a direction indicated by the arrow c from the above state, the inserting and pulling jig 180 can be rotated to a position at which the inserting and pulling jig 180 becomes upright as depicted in FIG. 28B. In cooperation with the rotation of the inserting and pulling jig 180, the pin pushing portion 200 of the inserting portion 196 abuts on the positioning pin 82 and pushes the positioning pin 82. Thereby, the module substrate 60 descends toward the connector 86 and the connectors 84 and 86 are connected to each other. At this time, the module substrate 60 descends toward the system board 62 and, therefore, the locking arm 164 is released from its binding position (a second position), is rotated by the restoring force of the coil spring 168, and is moved to a position above or immediately on the locking plate 102 of the module substrate 60. This position is a first position of the locking arm 164, and the locking bar 165 of the locking arm 164 is installed on the locking plate 102 in the module substrate 60. As a result, detachment of the module substrate 60 is prevented and completion of the connection of the connectors 84 and 86 to each other is identified based on the position of the locking bar 165. That is, the state of the connection of the connectors 84 and 86 to each other can be visually checked from an outside.

Even in the case where the module substrate 60 is placed on the system board 62, when the connectors 84 and 86 are not connected to each other, the locking bar 165 of the locking arm 164 is moved to an unlocked position (a second position) that is a position displaced by an angle "θ" from a locked position (a first position) as depicted in FIGS. 29A and 29B.

When the module substrate 60 is installed on the system board 62 and the connectors 84 and 86 are connected to each other, as depicted in FIGS. 30A and 30B, the locking bar 165 of the locking arm 164 is moved to the locked position (the first position).

D) Process of Detaching Inserting and Pulling Jig

After the connectors 84 and 86 are connected to each other, the inserting and pulling jig 180 is detached from the fixing module 72. When the locking bar 165 of the locking arm 164 is in its locked position (FIG. 30B), the state where the module substrate 60 is fixed and mounted is maintained.

Figure 31:
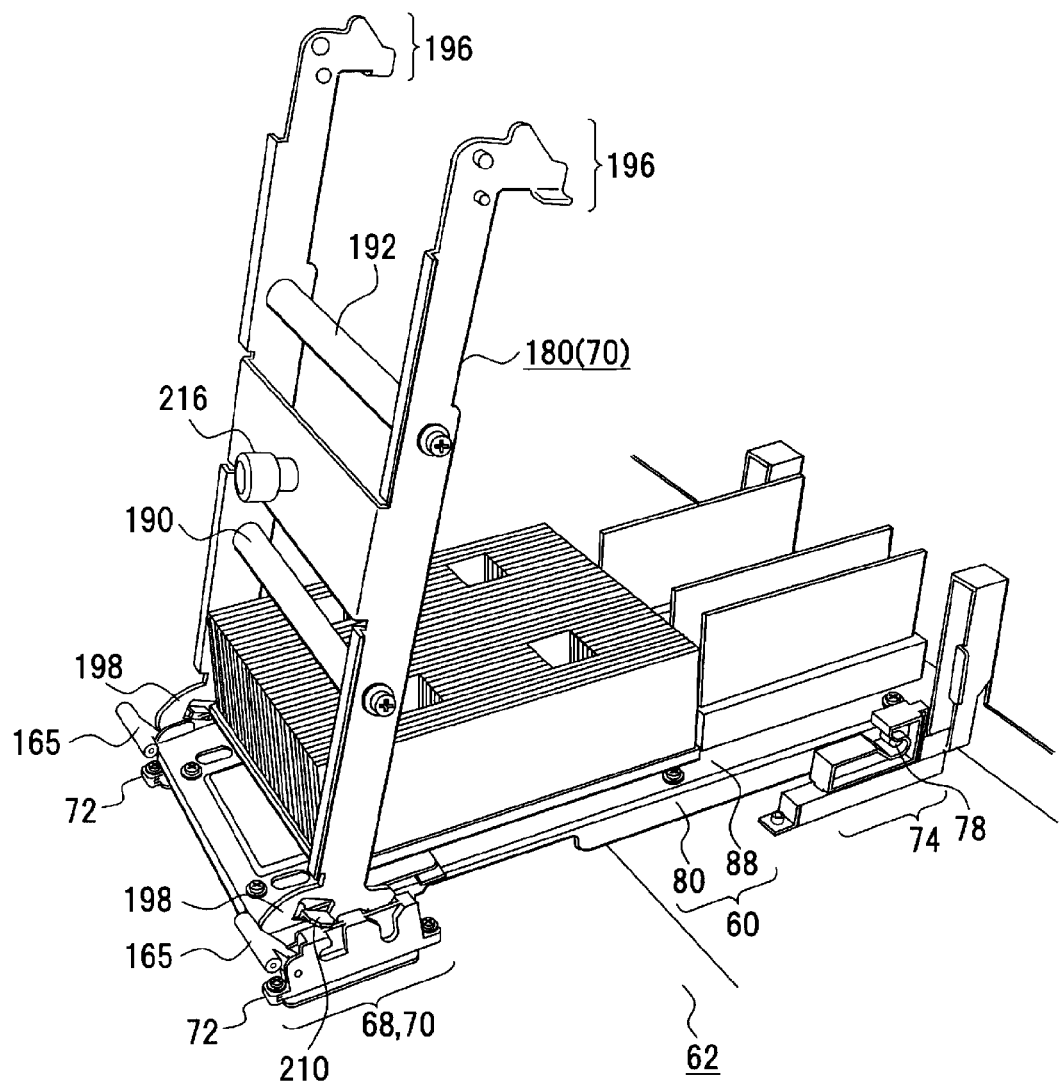
FIG. 31 is a diagram of attachment of the inserting and pulling jig.
Figure 33A:
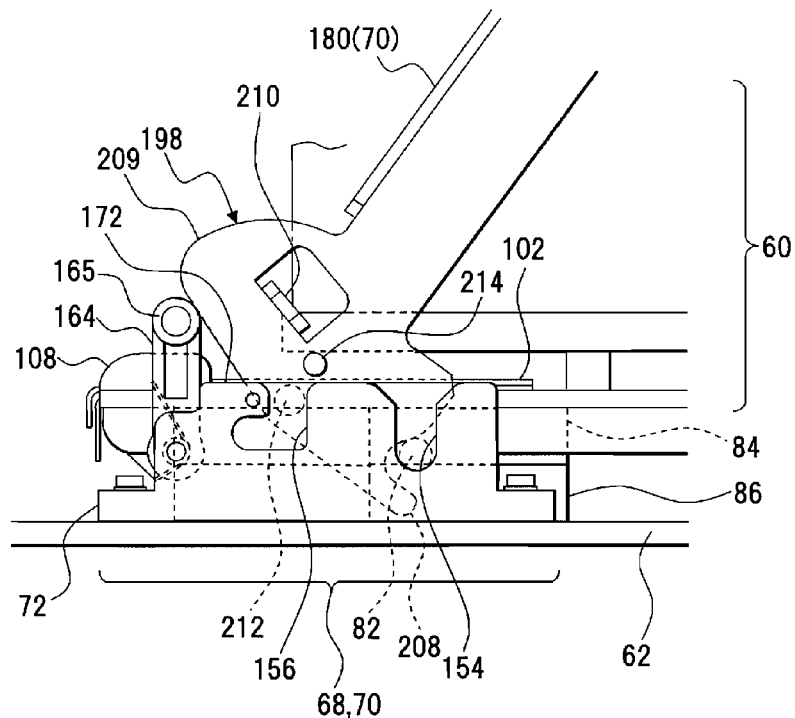
FIGS. 33A and 33B are diagrams of release of the locking and release of the connection of the module substrate by the inserting and pulling jig.
Figure 33B:
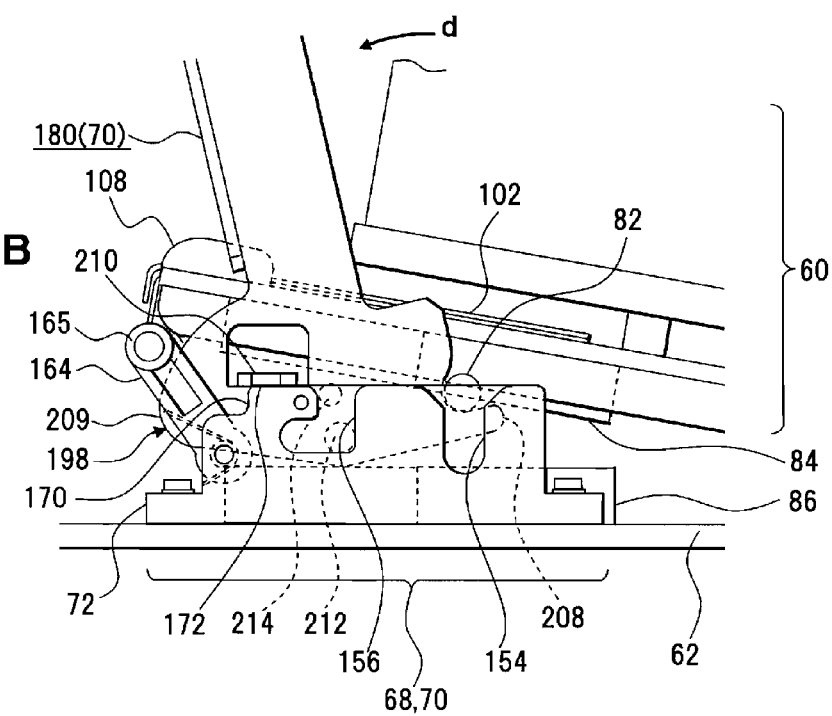
Figure 34:
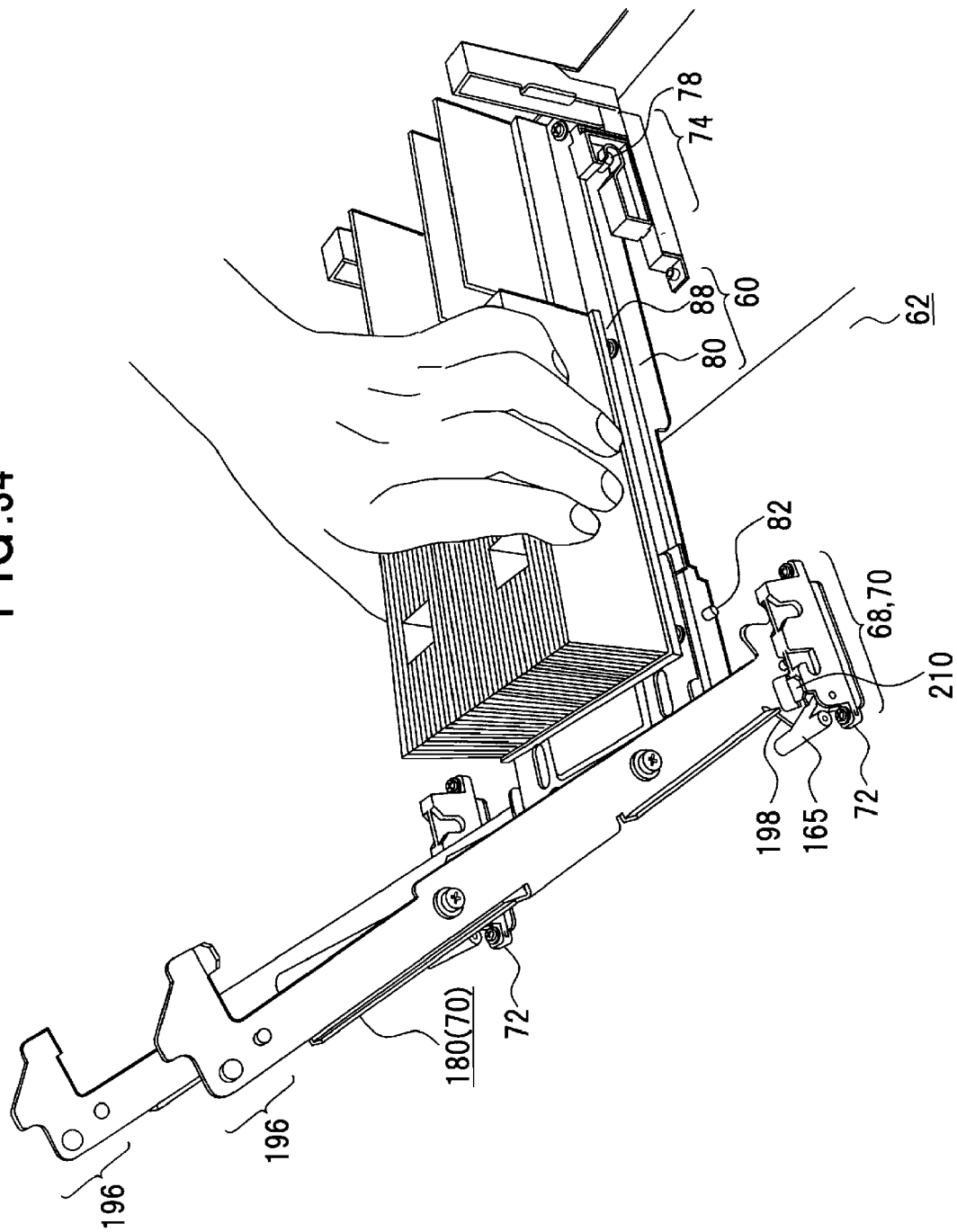
FIG. 34 is a diagram of an operation of the module substrate.

A pulling-out method of the module substrate 60 will be described with reference to FIGS. 31 to 34. FIG. 31 depicts attachment of the inserting and pulling jig. FIG. 32 depicts an operation of the inserting and pulling jig. FIGS. 33A and 33B depict release of the locking and pulling out of the module substrate by the operation of the inserting and pulling jig. FIG. 34 depicts detachment of the module substrate from the system board. In FIGS. 31 to 34, the same components as those in FIGS. 10 to 24B are given the same reference numerals.

The pulling-out method of the module substrate 60 includes E) process of attaching the inserting and pulling jig, F) process of releasing the connection and releasing the locking of the connectors and G) process of detaching the module substrate.

E) Process of Attaching Inserting and Pulling Jig

As depicted in FIG. 31, on the system board 62 mounted with the module substrate 60, the guiding pins 212 and 214 (FIG. 33A) of the pulling portion 198 of the inserting and pulling jig 180 are inserted into the inserting and pulling guiding grooves 156 and 160 (FIG. 20) of each fixing module 72 and, thereby, the inserting and pulling jig 180 is attached to the fixing module 72. In this case, the pin-lifting pawl 208 of the pulling portion 198 is inserted under the positioning pin 82 of the module substrate 60, that is, between the positioning pin 82 and the system board 62. When the pin-lifting pawl 208 is inserted at this position, the inserting and pulling jig 180 becomes substantially upright relative to the module substrate 60 (a position indicated by a dashed-two dotted line of FIG. 32).

F) Process of Releasing Connection and Releasing Locking of Connectors

When a force is applied to the inserting and pulling jig 180 attached to the fixing module 72 in a direction indicated by an arrow "d" as depicted in FIG. 32, the inserting and pulling jig 180 is rotated centering the guiding pins 212 as the rotation axis or the fulcrum inserted into the inserting and pulling guiding grooves 156 and 160. In response to this rotation, the locking arm 164 is caused to fall down, thereby, the locking of the module substrate 60 is released and the pin-lifting pawl 208 is also rotated due to the action of the lever, and the positioning pin 82 engaged with the pin-lifting pawl 208 is lifted. The module substrate 60 is rotated upward centering the locking pin 78 and the connector 84 of the module substrate 60 is detached from the connector 86 of the system board 62 and, thereby, the connection is released.

The release of the connection and the release of the locking of the connectors will be described with reference to FIGS. 33A and 33B. FIGS. 33A and 33B respectively depict the inserting and pulling jig 180 before and after the rotation. As depicted in FIG. 33A, the guiding pins 212 and 214 are aligned with the inserting and pulling guiding grooves 156 and 160 of the fixing module 72, and the pin-lifting pawl 208 is inserted under the positioning pin 82. As depicted in FIG. 33B, when the inserting and pulling jig 180 is rotated centering the guiding pins 212 and 214 in the direction indicated by the arrow d: the locking releasing portion 209 of the pulling portion 198 abuts on the locking bar 165 of the locking arm 164; the locking arm 164 is rotated to the position to release its locking; the positioning pin 82 engaged with the pin-lifting pawl 208 is lifted; and the connection between the connector 84 of the module substrate 60 and the connector 86 of the system board 62 is released.

The stopper portion 210 of the pulling portion 198 abuts and is stopped on the stopper face portion 172 of the main body 138 of the fixing module 72 and, thereby, the inserting and pulling jig 180 is maintained being upright on the fixing module 72. At this time, the locking bar 165 of the locking arm 164 abuts on the locking releasing portion 209 of the pulling portion 198 and is maintained in this state and, thereby, the locking bar 165 is obstructed from returning to its locked position.

G) Process of Detaching Module Substrate

After releasing the locking and releasing the connection of the connectors 84 and 86, as depicted in FIG. 34, the module substrate 60 can be detached from the system board 62 by a manual operation. This operation may be executed after detaching the inserting and pulling jig 180 from the fixing module 72. When the inserting and pulling jig 180 is left being installed, the detachment of the module substrate 60 is easy because the locking bar 165 of the locking arm 164 abuts on the locking releasing portion 209 of the pulling portion 198 and is maintained in this state and, therefore, the locking bar 165 is obstructed from returning to its locked position.

Figure 35A:
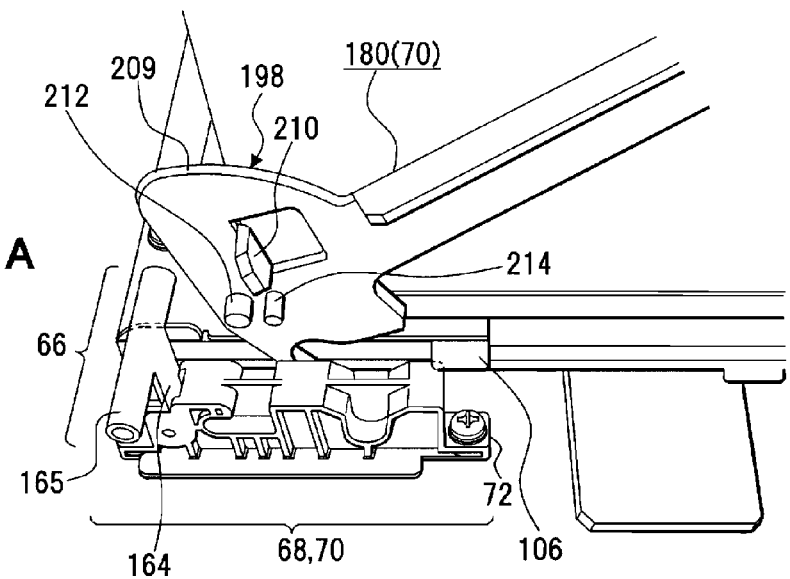
FIGS. 35A and 35B are diagrams of protection of parts mounted on the system board.
Figure 35B:
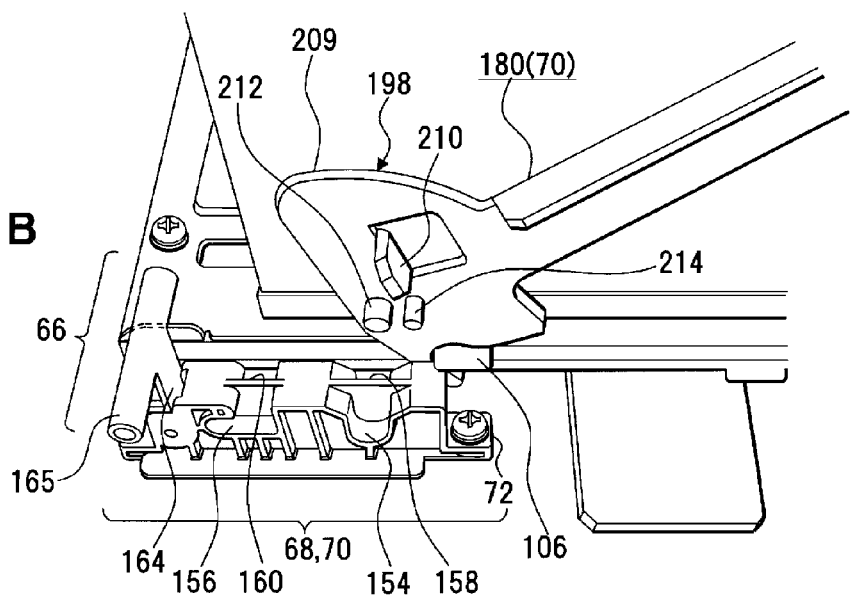

The insulating sheet will be described with reference to FIGS. 35A and 35B. FIGS. 35A and 35B depict the relation between the insulating sheet and the inserting and pulling jig. In FIGS. 35A and 35B, the same components as those in FIGS. 20 and 33A are given the same reference numerals.

When the module substrate 60 mounted on the system board 62 is detached, the pulling portion 198 of the inserting and pulling jig 180 needs to be positioned on the fixing module 72. When the module substrate 60 is mounted on the system board 62, the inserting portion 196 of the inserting and pulling jig 180 needs to be positioned on the fixing module 72. In these cases, as depicted in FIG. 35A, the protecting piece 106 of the insulating sheet 100 (FIG. 17) is protruded above the positioning grooves 154 and 158 of the fixing module 72.

In the case where the inserting portion 196 or the pulling portion 198 of the inserting and pulling jig 180 is moved to the fixing module 72, when the operation is executed with a wrong insertion position, as depicted in FIG. 35B, the inserting portion 196 or the pulling portion 198 of the inserting and pulling jig 180 comes into contact with the protecting piece 106 and this contact is transmitted as feeling to an operator operating the inserting and pulling jig 180. Therefore, the operator can recognize the error of the insertion position of the inserting and pulling jig 180, and insertion of the inserting and pulling jig 180 at the wrong position can be obstructed due to the presence of the protecting piece 106. Therefore, the parts mounted on the system board 62 can be protected from damage, etc., caused by the wrong operation of the inserting and pulling jig 180.

Features and variations of the above described first embodiment are as follows.

(1) Even in the case where the connectors 84 and 86 for the connection to the system board 62 are covered by the module substrate 60, when the connection is normal, the locking arm 164 is movable and moves to its upright state that is its first position (FIGS. 19 and 30B) and the fact that the connection is normal can be displayed by the locking bar 165 being horizontal, and whether the module substrate 60 is normally mounted on the system board 62 can easily be checked by checking the position, that is, the angle of the locking bar 165. The module substrate 60 normally mounted is locked on the system board 62 by the locking bar 165 of the locking arm 164 of the locking mechanism 66 and, therefore, releasing of the connection of the module substrate 60 by an external force can be prevented and the reliability of the connection can be improved.

(2) The inserting and pulling jig 180 is used for the connection using the connectors of the module substrate 60 and the connection using the connectors and the locking arm 164 can be operated associated with each other. Therefore, the locking of the module substrate 60 and the operation for the connection using the connectors can simultaneously be executed, and the inserting and pulling jig 180 can be operated with one hand. Therefore, the workability of the insertion work of the module substrate 60 can be improved.

(3) The releasing of the locking of the module substrate 60 mounted on the system board 62 and the operation of pulling out the module substrate 60 can simultaneously be executed using the inserting and pulling jig 180, and can simultaneously be executed with one hand. Therefore, the workability of the pulling out of the module substrate 60 can be improved.

Figure 2:
FIG. 2 is a diagram of the conventional connection between the substrates using the connectors.
Figure 3:
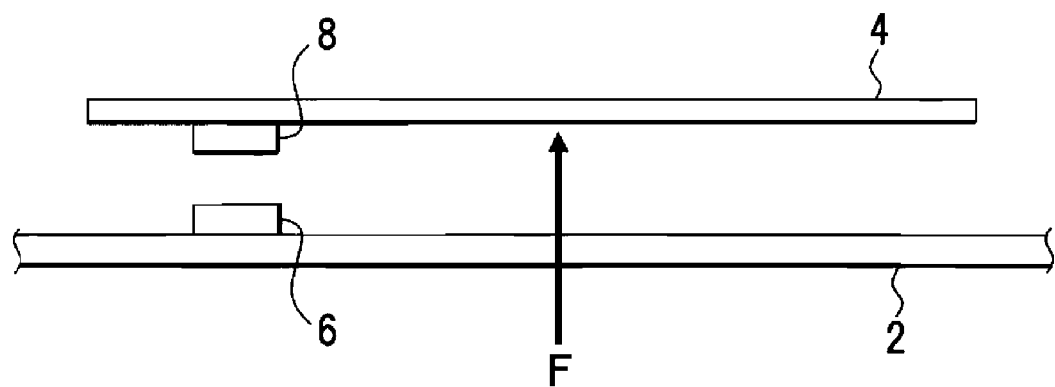
FIG. 3 is a diagram of release of the conventional connection between the substrates using the connectors.
Figure 4:
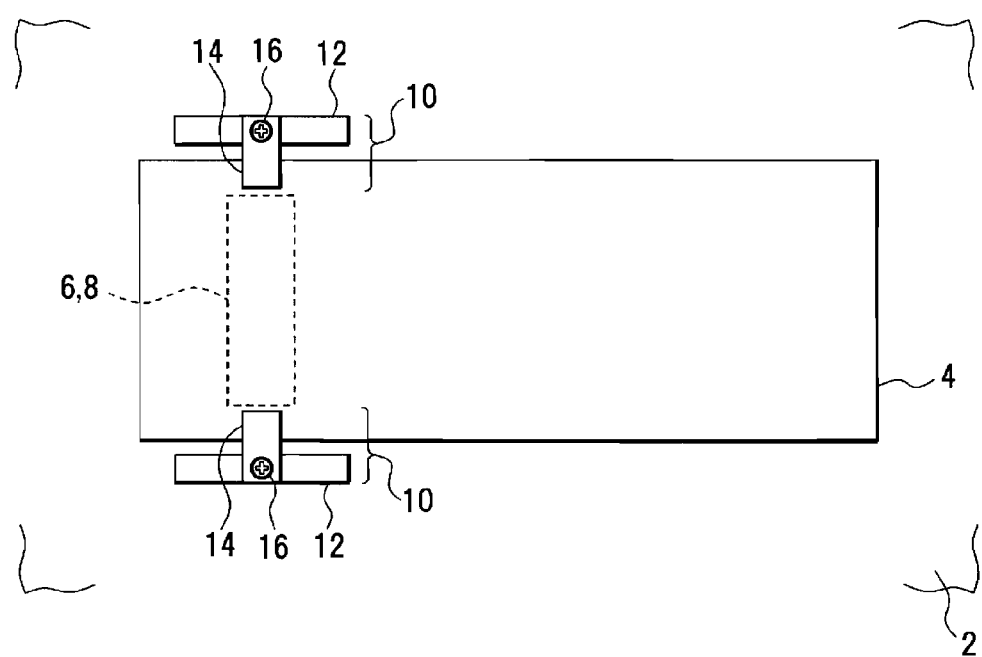
FIG. 4 is a diagram of a conventional locking mechanism between the substrates.
Figure 5:
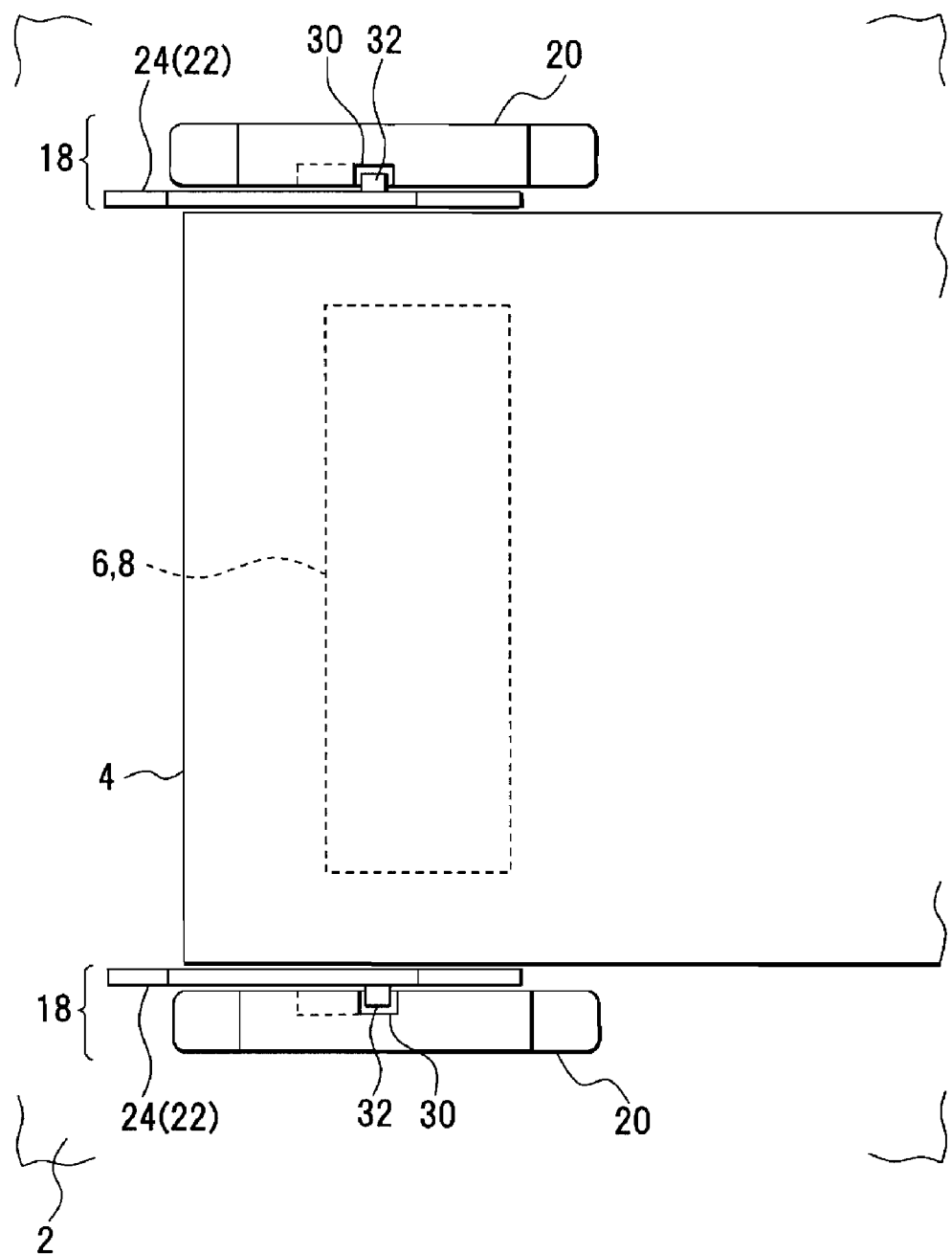
FIG. 5 is a diagram of a conventional inserting and pulling structure for the substrates.
Figure 6:
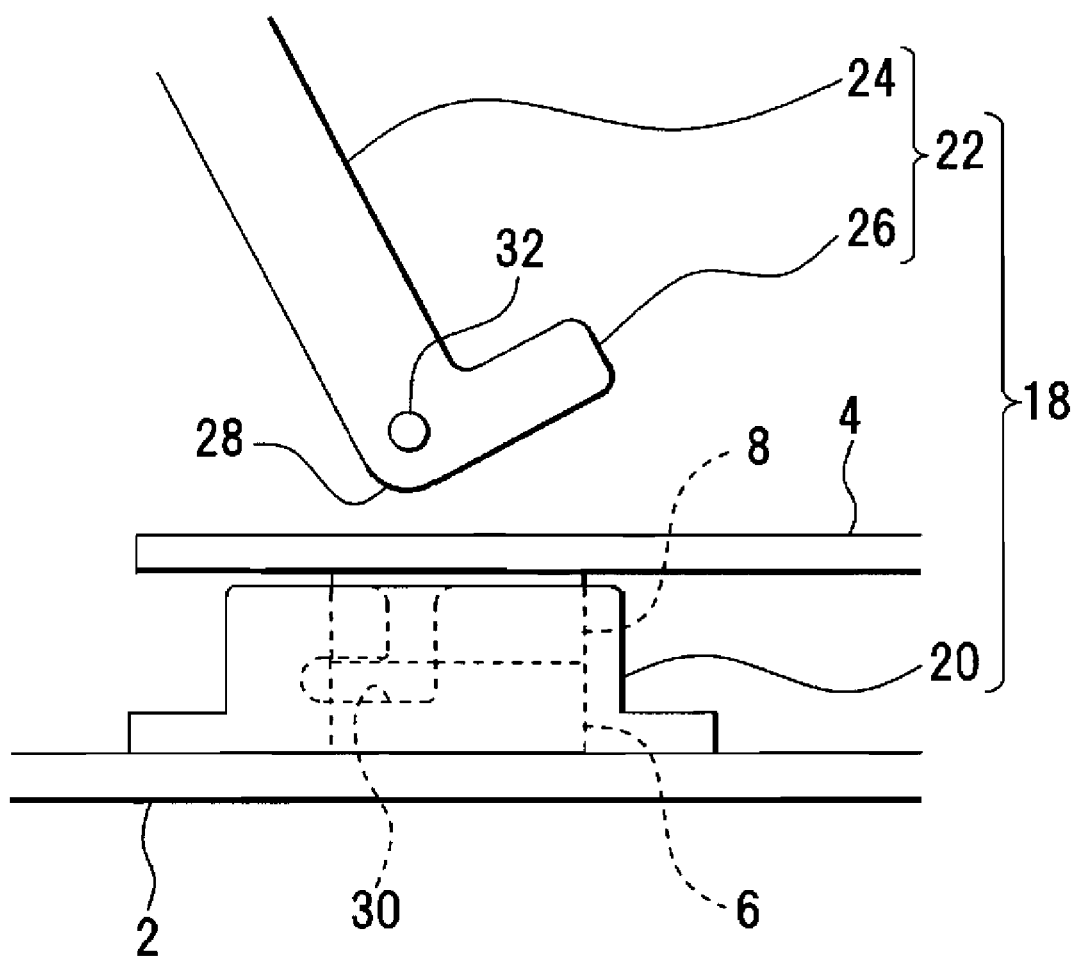
FIG. 6 is a diagram of the conventional inserting and pulling structure for the substrates.
Figure 7A:
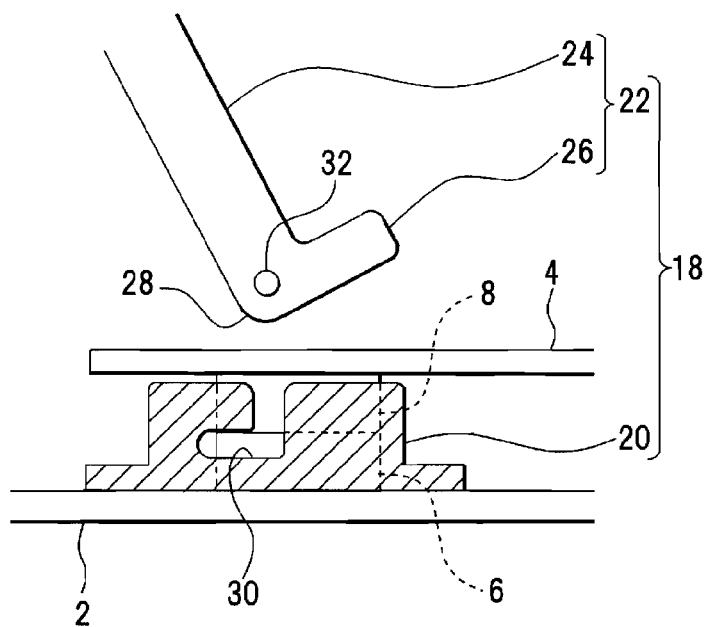
FIGS. 7A, 7B and 7C are diagrams of a conventional inserting and pulling procedure for the substrates.
Figure 7B:
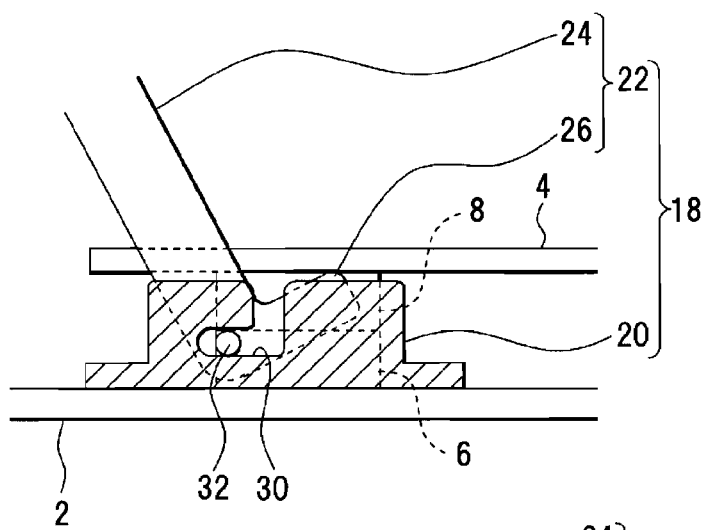
Figure 7C:
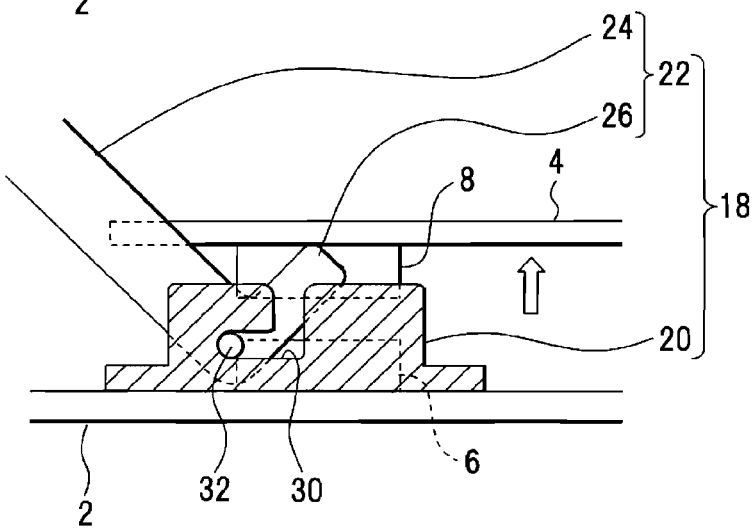
Figure 8A:
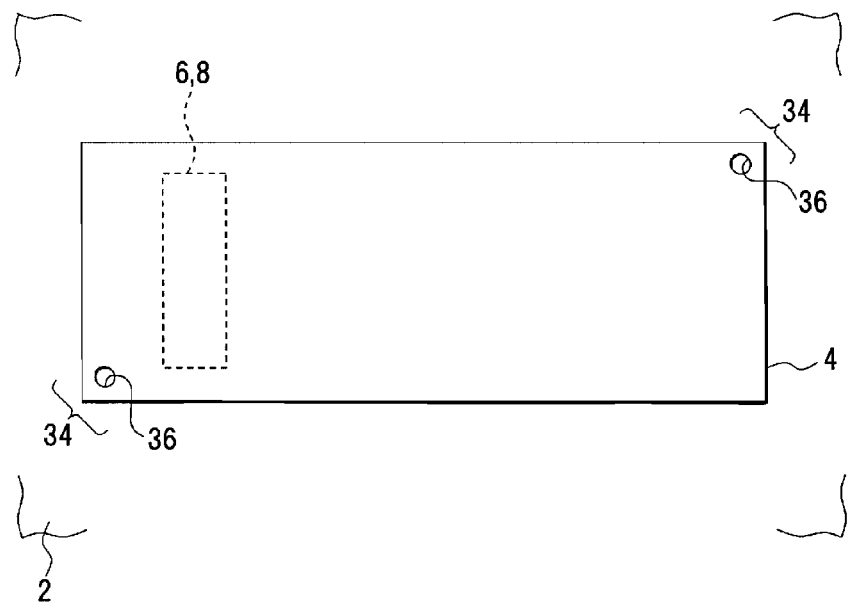
FIGS. 8A and 8B are diagrams of a conventional positioning mechanism between the substrates.
Figure 8B:
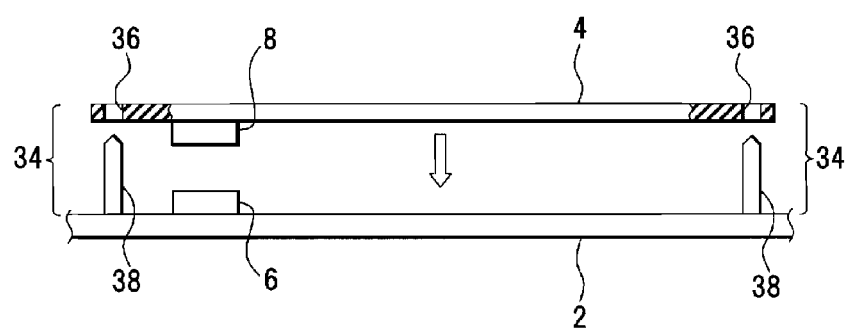
Figure 9:
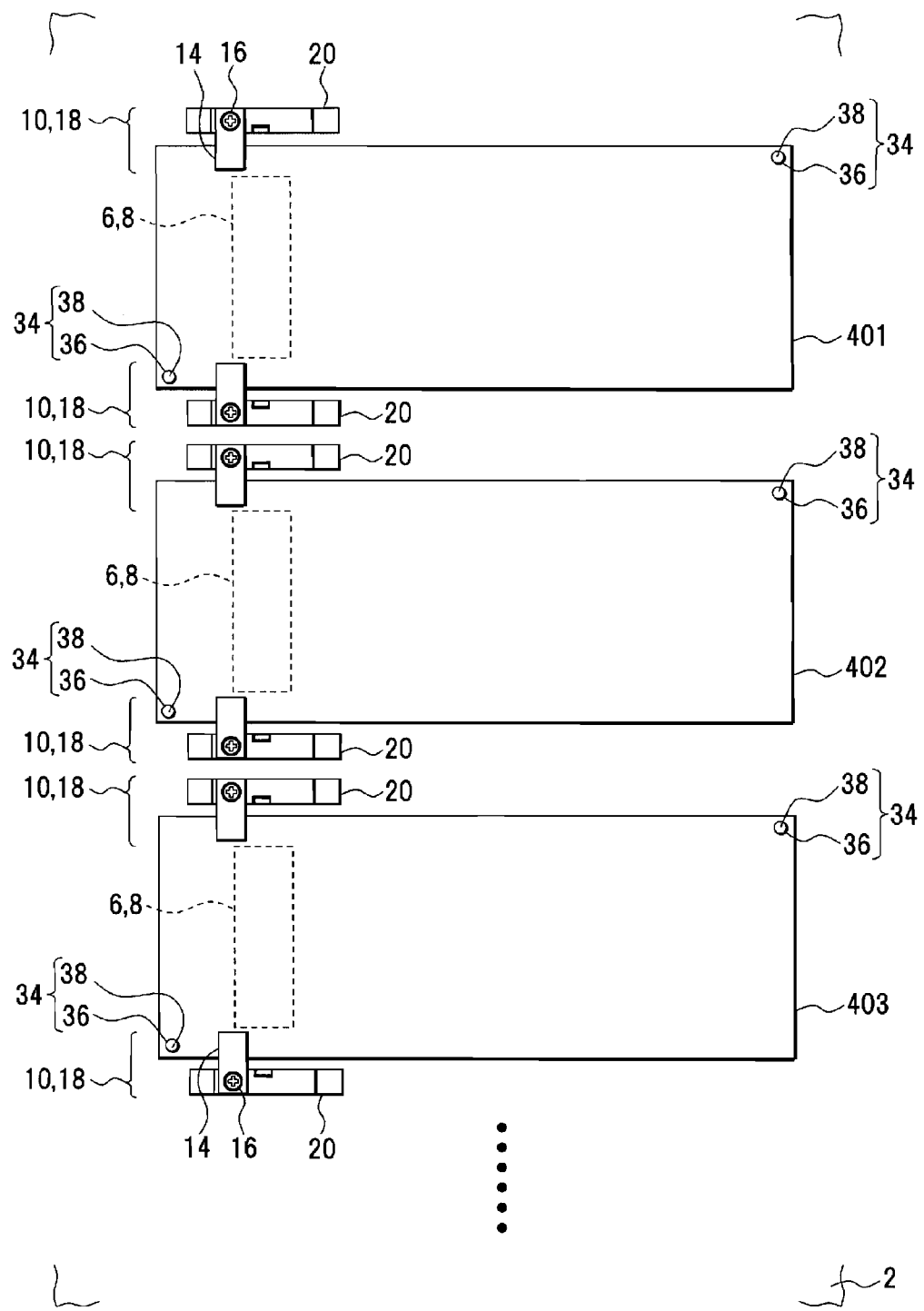
FIG. 9 is a diagram of a conventional connecting structure that includes the locking mechanism, the inserting and pulling structure and the positioning mechanism between the substrates.

(4) The fixing module 72 is attached with the locking arm 164 of the locking mechanism 66. The positioning grooves 154 and 158 and the inserting and pulling guiding grooves 156 and 160 are provided as two types of grooves and the locking mechanism 66, the positioning mechanism 68, and the inserting and pulling mechanism 70 of the module substrate 60 are integrated together and, therefore, reduction of the number of parts can be facilitated. The conventional positioning pin 38 (FIG. 8B) is unnecessary.

(5) The module substrate 60 is adapted to be inserted and pulled out by the inserting and pulling jig 180 and the locking guide 108 of the insulating sheet 100 is adapted to overhang from the module substrate 60 and be superimposed on the fixing module 72. With such a configuration, even when the inserting and pulling jig 180 is mistakenly operated, interference with parts on a printed board such as the system board 62 can be avoided and the mounted parts can be protected.

(6) By using the common fixing module 72, locking of the plurality of module substrates 60 installed adjacent to each other can simultaneously be executed and, therefore, reduction of the cost can be facilitated by reducing the number of parts.

(7) By only attaching the inserting and pulling jig 180 to two fixing modules 72 astride the module substrate 60, the work of connecting using the connectors and locking of, and the work of releasing of the connection using the connectors and releasing of the locking of the module substrate 60 can simultaneously be executed, the operations can be executed with one hand, etc. Therefore, simplification of the inserting and pulling work and improvement of its workability can be facilitated.

Second Embodiment

A second embodiment will be described with reference to FIG. 36. FIG. 36 depicts a plurality of module substrates provided adjacent to each other. The configuration depicted is an example and the present invention is not limited to the configuration.

In the embodiment, three sets of module substrates 601, 602 and 603 as the plurality of module substrates 60 are installed on the top face of the system board 62, and, corresponding to these module substrates 601 to 603, four sets of fixing modules 721, 722, 723 and 724 as a plurality of fixing modules 72 are installed. In this case: the fixing module 722 is commonly used by the module substrates 601 and 602; the fixing module 723 is commonly used by the module substrates 602 and 603; a locking bar 165 of a locking arm 164 of a locking mechanism 66 is used astride the module substrates 601 and 602 adjacent to each other and the module substrates 602 and 603 adjacent to each other; and, thereby, simplification of the fixing module 72, the locking arm 164 and the locking bar 165 is facilitated.

As above, the fixing module 72 (721 to 724) is formed with the first and the second positioning grooves 154 and 158 (FIG. 20) on both sides of the main body 138 and, therefore, these positioning grooves 154 and 158 can be used to position the module substrates 601 and 602 adjacent to each other, and 602 and 603 adjacent to each other, and the first and the second inserting and pulling guiding grooves 156 and 160 (FIG. 20) are formed on both sides of the main body 138 and, therefore, these inserting and pulling guiding grooves 156 and 160 can be used commonly for inserting and pulling out of the module substrates 601 and 602, and 602 and 603 by the inserting and pulling jig 180.

According to the above configuration, denoting the width of the fixing module 72 as "$W_1$", and the spacing between the module substrates 601 and 602, and 602 and 603 as "$W_2$", $W_2$ can be set to be a spacing width is close to $W_1$ and, thereby, the spacing for installing the plurality of module substrates 60 can be narrowed. Therefore, the area for installing the module substrates 60 on the system board 62 can be reduced.

Denoting the number of the module substrates 60 installed as "N" and the number of the fixing modules 72 installed as "n", because the fixing modules 72 can be commonly used by the module substrates 60 adjacent to each other, the number of the fixing modules 72 installed n relative to the number of the module substrates 60 installed N is as follows.

$$n=N+1 \qquad (1)$$

Therefore, the number of the fixing modules 72 installed that is larger than the number of the module substrates 60 N by one may be sufficient and, therefore, simplification of a locking mechanism 66, a positioning mechanism 68 and an inserting and pulling mechanism 70 can be facilitated.

In the embodiment, the width of the fixing module 72 and the width of a guiding and locking module 74 may be set to be the same that is $W_1$ or the width of the guiding and locking module 74 may be set to be smaller than the width $W_1$ of the fixing module 72.

Features and variations of the above described second embodiment are as follows.

(1) When the plurality of module substrates 60 are disposed at the same intervals as the module substrates 601 to 603 and the fixing module 72 is disposed in the center between the module substrates 60 adjacent to each other as the fixing modules 721 to 724, the positioning, the locking, or the inserting and pulling out of the plurality of module substrates 60 can be executed using the common fixing module 72. When the shape of the fixing module 72 is made symmetrical with the center of the parts, the fixing module 72 can be commonly used and reduction of the cost due to reduction of the number of parts, etc. can be facilitated.

(2) The shape of the fixing module 72 is symmetrical centering the module substrate 60 and, by disposing the fixing modules 72 each between module substrates 60 that are adjacent to each other, the number of the fixing modules 72 installed may be more than the number of the module substrates 60 installed by only one for the plurality of module substrates 60 installed beside the fixing modules 72. Therefore, the number of parts and the area for installation can be reduced and a contribution can be made to effective use of the mounting area on the system board 62 that is the second substrate.

Third Embodiment

Figure 37:
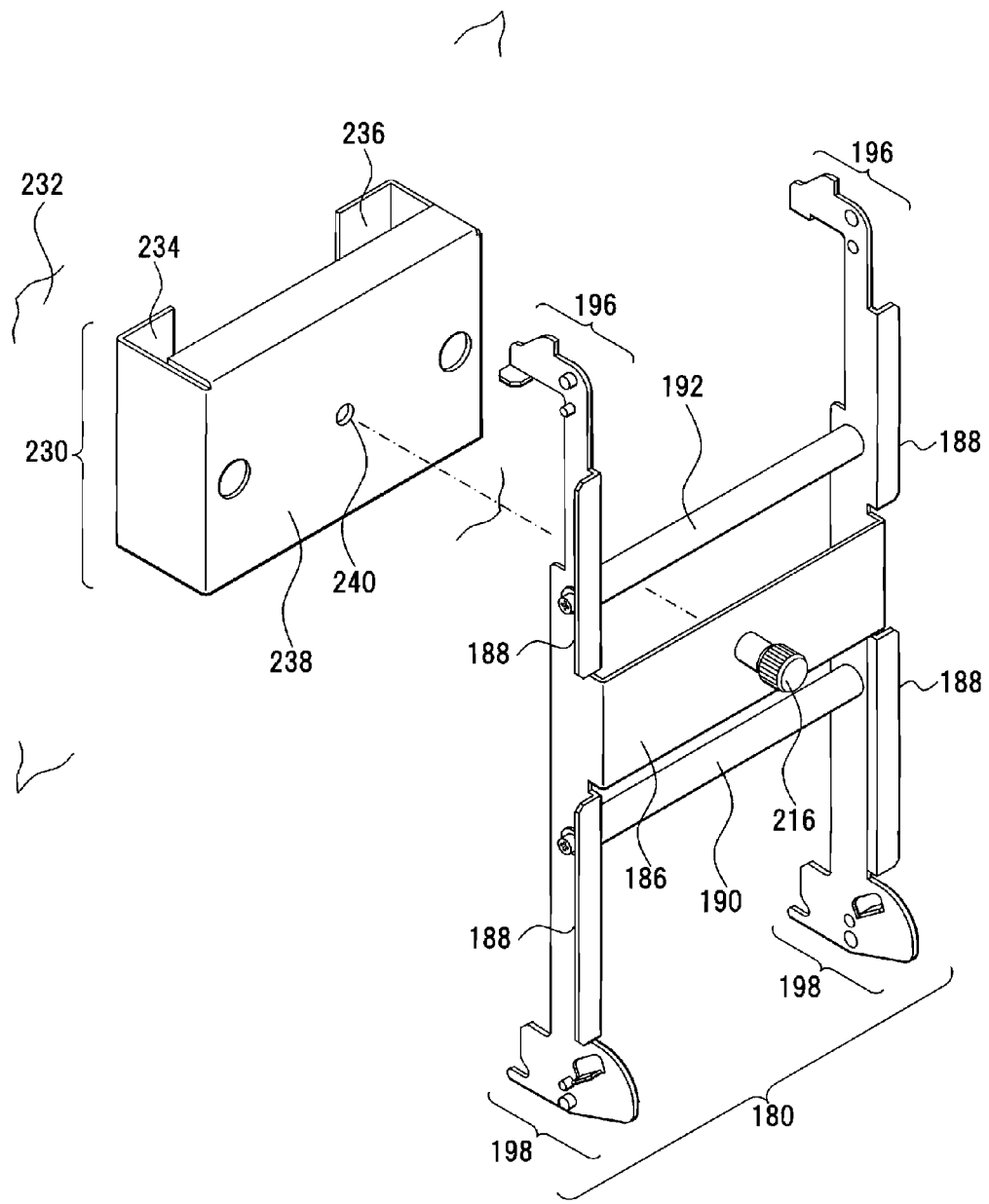
FIG. 37 is a diagram of storage of an inserting and pulling jig according to a third embodiment.

Storage of the inserting and pulling jig 180 will be described with reference to FIG. 37. FIG. 37 depicts the inserting and pulling jig and a storing jig therefor. The configuration depicted is an example and the present invention is not limited to the configuration. In FIG. 37, the same components as those in FIGS. 22 and 23 are given the same reference numerals.

A storing jig 230 is used to store the inserting and pulling jig 180. The storing jig 230 is provided with fixing portions 234 and 236 that fix the storing jig 230 to a wall 232 of the server apparatus 50. Therefore, recesses to fix the fixing portions 234 and 236 may be installed on the wall 232. The storing jig 230 is formed with an abutting portion 238 to be abutted on by the bridging portion 186 of the inserting and pulling jig 180. The abutting portion 238 is formed having a width that is slightly narrower than the width of the bridging portion 186, and is formed with a screw hole 240 in its central portion. The fixing screw 216 of the inserting and pulling jig 180 is operated from the outer face of the inserting and pulling jig 180 to the screw hole 240 and, by screwing the screw portion 224 (FIG. 24B), the inserting and pulling jig 180 is fixed to the storing jig 230 and can be stored at a predetermined position of the server apparatus 50. The inserting and pulling jig 180 stored can easily be released from the storing jig 230 by an operation of the fixing screw 216 and can be used to insert or pull out the module substrates 60.

Fourth Embodiment

Figure 38:
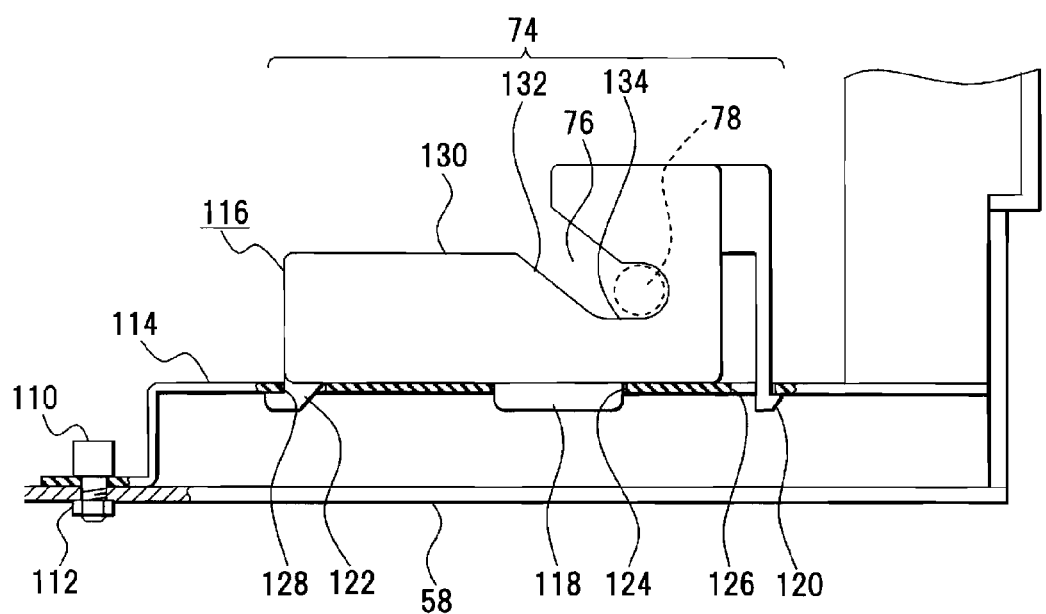
FIG. 38 is a diagram of a guiding and locking module according to a fourth embodiment.
Figure 39:
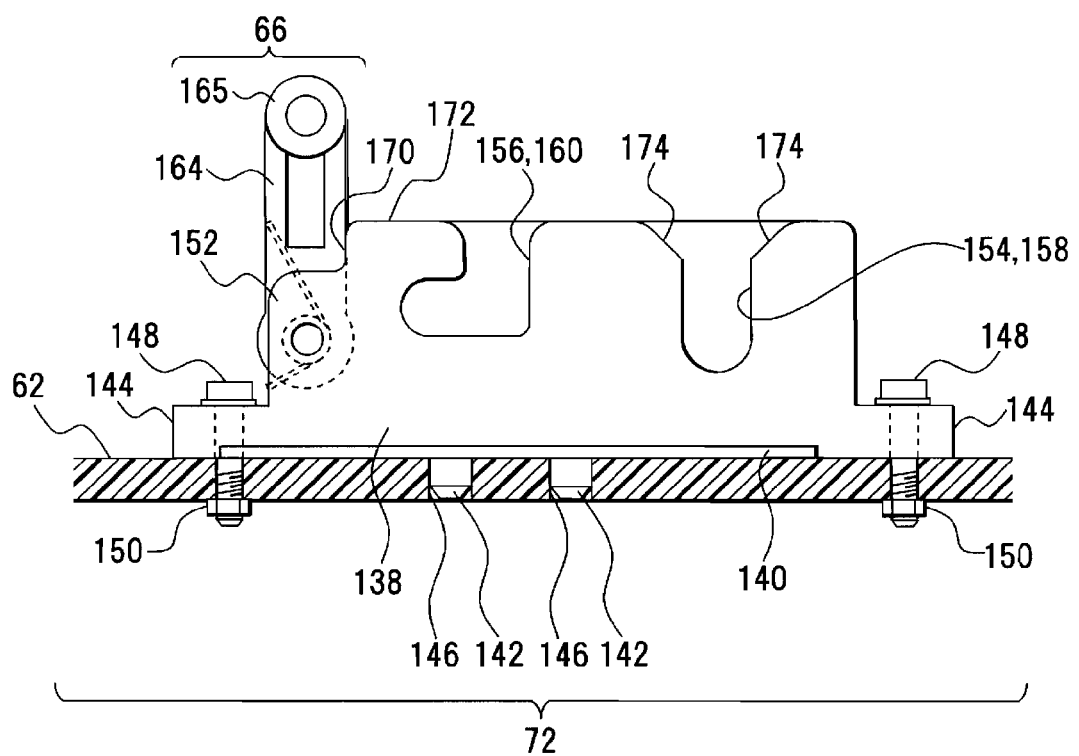
FIG. 39 is a diagram of a fixing module according to the fourth embodiment.

A fourth embodiment will be described with reference to FIGS. 38 and 39. FIG. 38 depicts a guiding and locking module and its attachment. FIG. 39 depicts a fixing module and its attachment. The configuration depicted is an example and the present invention is not limited to the configuration.

In the above embodiments, the guiding groove 76 of the guiding and locking module 74 fixed to the chassis 58 by the vis 110 and the nut 112 is formed by the standing wall 136. However, as depicted in FIG. 38, the guiding groove 76 may be formed as a flat face of the main body 116 without forming such standing wall 136.

In the above embodiments, the positioning grooves 154 and 158 and the inserting and pulling guiding grooves 156 and 160 of the fixing module 72 are formed by the standing wall 161. However, as depicted in FIG. 39, the positioning grooves 154 and 158 and the inserting and pulling guiding grooves 156 and 160 may be formed as flat faces of the main body 138 without forming such standing wall 161.

In FIGS. 38 and 39, the same components as those in FIGS. 18 and 19 are given the same reference numerals and will not again be described.

Fifth Embodiment

Figure 40:
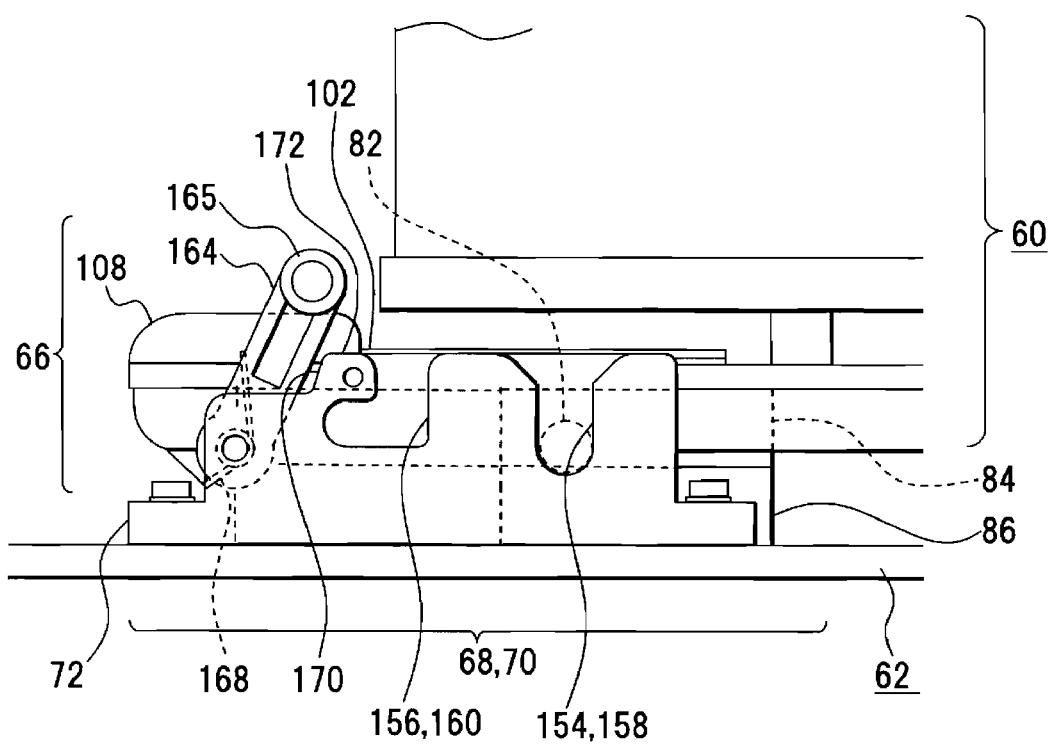
FIG. 40 is a diagram of a pressing structure of a module substrate according to a fifth embodiment.

A fifth embodiment will be described with reference to FIG. 40. FIG. 40 depicts a locking bar combined with a pressing structure of a module substrate. The configuration depicted is an example and the present invention is not limited to the configuration. In FIG. 40, the same components as those in FIGS. 30A and 30B are given the same reference numerals.

In the above embodiment (FIG. 30B), the locking arm 164 that moves to its locked position on the locking plate 102 of the module substrate 60 is adapted to be hooked at the position for the locking arm 164 to be upright, by the stopper portion 170 of the fixing module 72. However, as depicted in FIG. 40, the stopper portion 170 may be adapted to be retracted to the vicinity of the inserting and pulling guiding groove 156 or 160.

By configuring as above, due to the restoring force of the coil spring 168 installed between the locking arm 164 and the fixing module 72, the locking arm 164 is applied with the restoring force and is moved onto the locking guide 108 of the locking plate 102 and the locking plate 102 is pushed by the locking bar 165. That is, the locking bar 165 is applied with the restoring force of the coil spring 168 and, thereby, functions as a pushing portion. Due to this pushing, the module substrate 60 is locked by the locking bar 165 on the system board 62 and, as a result, even when an external force is applied to the module substrate 60 in the direction for releasing, the connection between the connectors 84 and 86 by the locking bar 165 is maintained. Therefore, the reliability of the connection is improved.

According to the above configuration, the insertion by the inserting portion 196 and the pulling out by the pulling portion 198, of the inserting and pulling jig 180 can similarly be executed and, therefore, the details thereof are as above and will not again be described.

Other Embodiments

Though the server apparatus 50 has been exemplified in the above embodiments, the present invention can be applied to various apparatuses that each include a plurality of substrates and the plurality of substrates need to be connected using connectors being positioned, and the present invention is not limited to the server apparatus 50.

In the above embodiment (the fifth embodiment: FIG. 40), the locking bar 165 is adapted to be the pushing portion that pushes the locking plate 102 of the module substrate 60, and the restoring force of the coil spring 168 pivoted by the rotating shaft 162 that supports the locking arm 164 is used as the pushing force. However, in addition to such a coil spring 168, any component may be used that causes the locking bar 165 to descend on the locking plate 102 and, thereby, pushes the locking plate 102.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

Technical ideas extracted from the embodiments of the present invention described above are listed. The technical ideas according to the present invention can be obtained by various levels and variations from a generic concept to a more specific concept, and following do not limit the present invention.

An apparatus includes a first substrate; a first connector to be disposed on a top face of the first substrate; a to-be-fixed member to be disposed on a back face of the first substrate; a second substrate to be disposed facing the first substrate; a second connector to be disposed on the second substrate, the second connector being connected to the first connector; and a fixing module to be disposed on the second substrate, the fixing module pivoting a locking arm using a rotating shaft, a pushing portion being provided for a tip of the locking arm, the locking arm pushing the to-be-fixed member using the pushing portion at a first position in a state that the first connector and the second connector are connected to each other.

According to the above configuration, the first and the second substrates are connected to each other by the engagement of the first and the second connectors with each other and, in this connection state, the pushing portion on the tip of the locking arm pivoted by the rotating shaft on the fixing module of the second substrate pushes the to-be-fixed member of the first substrate. Therefore, the connection state of the first and the second substrates is locked and, even when an external force such as a vibration is applied, the connectors can be prevented from being detached. Therefore, the reliability of the connection can be improved.

In the above apparatus, preferably, the fixing module may push the locking arm to the first position using a spring, and the locking arm may be rotatable to a second position that is different from the first position, and may not push the first substrate at the second position. The first substrate may further include two positioning pins to be disposed facing each other in a periphery of the first substrate and position a position of the first connector relative to a position of the second connector, wherein the fixing module further includes a first positioning groove into which the positioning pins are inserted at predetermined positions, and wherein the second substrate positions the first substrate relative to the second substrate by disposing two of the fixing modules whose first positioning grooves are inserted with the positioning pins, such that the two fixing modules hold the first substrate sandwiching the first substrate therebetween in a state that the first and the second connectors are connected to each other. The pushing portion may have a shape that is same as or a substantial T-shape, and wherein the fixing module further includes a second positioning groove on a back face of a face for which the first positioning groove is provided and, thereby, fixes two of the first substrates that are disposed on the right and left of the fixing module and that are adjacent to each other, to the second substrate. The fixing module may further include an inserting and pulling guiding groove to be inserted with a guiding pin that an inserting and pulling jig to insert or pull out the first substrate into or from the second substrate includes, a cross section of the guiding groove having a shape that is same as or approximately an L-shape, wherein the inserting and pulling jig includes a hooking portion to hook the positioning pin, and rotates centering as a rotation axis the guiding pin inserted into the inserting and pulling guiding groove and, thereby, pushes down the locking arm from the first position to the second position, and wherein the hooking portion lifts the first substrate hooking the positioning pin associated with the rotation.

An apparatus includes a first substrate; a first connector to be disposed on a top face of the first substrate; a guiding unit to be disposed on a back face of the first substrate; a second substrate to be disposed facing the first substrate; a second connector to be disposed on the second substrate, the second connector being connected to the first connector; and a fixing module to be disposed on the second substrate, the fixing module pivoting a locking arm using a rotating shaft, a detachment preventing portion being provided for a tip of the locking arm, the detachment preventing portion being positioned immediately above the guiding portion at a first position in a state that the first and the second connectors are connected to each other.

According to the above configuration, when the first connector disposed on the top face of the first substrate and the second connector disposed on the second substrate are connected to each other, the locking arm pivoted to the fixing module by the rotating shaft is rotated and, thereby, the detachment preventing portion provided for the tip of the locking arm is positioned at immediately above the guiding portion disposed on the back face of the first substrate. Therefore, the connection of the first connector of the first substrate and the second connector of the second substrate to each other is locked and detachment of the first substrate from the second substrate can be prevented. Therefore, the reliability of the connection can be improved.

In a mounting structure to push a first substrate having a first connector disposed thereon to a second substrate having a second connecter to be connected to the first connector disposed thereon facing the first connector in a state that the first and the second connectors are connected to each other, the first substrate has a to-be-fixed member to be disposed on a back face of a face on which the first connector is disposed, the second substrate has a locking arm to have on its tip a pushing portion pushing the first substrate and to be rotatable between a first position and a second position that is different from the first position, and a fixing module to pivot the locking arm using a rotating shaft, and the locking arm pushes the to-be-fixed member using the pushing portion at the first position and does not push the second substrate at the second position that is different from the first position.

According to the above configuration, the first and the second substrates are connected to each other by the engagement of the first and the second connectors with each other and, in this connection state, the locking arm pivoted by the rotating shaft to the fixing module of the second substrate is rotated between the first and the second positions and, thereby, the pushing portion of the locking arm pushes the to-be-fixed member of the first substrate at the first position and the pushing to the to-be-fixed member of the first substrate is released at the second position. Thereby, the connection state of the first and the second substrates to each other is locked at the first position and, even when an external force such as a vibration is applied, the connectors can be prevented from detaching from each other. Therefore, the reliability of the connection can be improved.

In an inserting and pulling jig to insert or pull out a first substrate having two positioning pins disposed facing each other in a periphery of the first substrate into or from a second substrate, the second substrate further includes two fixing modules to each have an inserting and pulling guiding groove to be inserted with a guiding pin that the inserting and pulling jig has, a cross section of the guiding groove being same as or approximately an L-shape, the two fixing modules being disposed to hold the first substrate sandwiching the first substrate therebetween, the inserting and pulling jig has two board-like members to face each other and to be formed such that the board-like members each are rotated centering as its rotation axis the guiding pin inserted into the inserting and pulling guiding groove and, thereby, the board-like members push down the locking arm from a first position to a second position, and each of the board-like members has a hooking portion to lift the first substrate hooking the guiding pin and the positioning pins inserted into the inserting and pulling guiding groove.

According to the above configuration, the second substrate includes the two fixing modules disposed such that the two fixing modules hold the first substrate sandwiching the first substrate therebetween. Each of the fixing modules includes an inserting and pulling guiding groove whose cross section has the shape same as or approximately an L-shape. The inserting and pulling jig includes two board-like members that are formed such that each of the two board-like members rotates centering the guiding pin as its rotation axis to be inserted into the inserting and pulling guiding groove and, thereby, pushes down the locking arm from its first position to its second position. Each of the board-like members includes the guiding pin to be inserted into the inserting and pulling guiding groove and the hooking portion that lifts the first substrate hooking the positioning pin of the first substrate. Therefore, the first substrate can easily be inserted and pulled out into/from the second substrate using the inserting and pulling jig.

A fixing method to fix a first substrate that has a first connector disposed on a top face of the first substrate, a to-be-fixed member disposed on a back face of the first substrate, and positioning pins disposed facing each other in a periphery of the first substrate, to a second substrate that is disposed thereon with a second connector to be connected to the first connector, using a fixing module that fixes the first substrate disposed on the second substrate, includes positioning the first substrate relative to the second substrate by inserting the positioning pins into the positioning groove that the fixing module has; connecting the first connector to the second connector; and rotating a locking arm pivoted by a rotating shaft to a position at which a pushing portion provided for a tip of the locking arm pushes the to-be-fixed member.

According to the above configuration, the positioning pin of the first substrate is inserted into the positioning groove included by the fixing module installed on the second substrate and, thereby, the first substrate can be positioned relative to the second substrate. The first connector of the first substrate positioned is connected to the second connector of the second substrate and the locking arm pivoted by the rotating shaft on the second substrate is rotated. Thereby, the pushing portion provided for the tip of the locking arm can push the to-be-fixed member of the first substrate and the first substrate can be connected with the connectors to the second substrate and can be locked on the second substrate.

According to the embodiments of the present invention, the following effects can be achieved.

(1) According to the apparatus, the mounting structure or the fixing method of the present invention, concerning a connection between substrates using connectors, inserting and pulling out of can be facilitated and the reliability of the connection can be improved. A connecting mechanism can be simplified and the number of parts can be reduced. Therefore, reduction of the cost can be facilitated and simplification of the check on the connection state of the connection between the substrates can be facilitated.

(2) According to the apparatus, the mounting structure or the fixing method of the present invention, a locking arm indicates the state of a connection using connectors. Therefore, the state of the connection using the connectors can easily be checked from the exterior of the first substrate based on the position or the inclination of the locking arm.

(3) According to the apparatus, the mounting structure or the fixing method of the present invention, a plurality of first substrates can simultaneously be locked to the second substrate. Therefore, reduction of the cost can be facilitated by reducing the number of parts for the locking.

(4) A fixing module can be commonly used for a plurality of functions such as, for example, positioning, inserting and pulling out and locking and, therefore, the number of parts can be reduced. Therefore, reduction of the cost can be achieved and assembling workability can be improved.

(5) A detachment preventing portion of the locking arm pivoted to the fixing module is adapted to be positioned on a guiding portion on a back side of the first substrate when a first connector of the first substrate is connected to a second connector of the second substrate. Therefore, the detachment preventing portion can prevent the first substrate from detaching and the reliability of the connection can be improved.

(6) When the plurality of first substrates are mounted on the second substrate, parts such as the fixing module can be commonly used for the first substrates on both sides of the parts. Therefore, the number of each of the positioning parts, inserting and pulling parts and the locking parts may be more than the number of the first substrates by only one. Therefore, due to the reduction of the number of parts, reduction of the cost can be facilitated and the assembling workability can be improved.

(7) According to the inserting and pulling jig or the fixing method of the present invention, because the inserting and pulling jig is used, the cost can be reduced by reducing the number of parts for the inserting and pulling.

(8) According to the inserting and pulling jig or the fixing method of the present invention, the connection of the first and the second substrates to each other using connectors and the locking work of the first and the second substrates can simultaneously be executed and simplification of operations such as one-hand operations can be facilitated.

As above, the most preferred embodiments of the present invention have been described. However, the present invention is not limited by the above description. Various variations and changes may naturally be made to the present invention by those skilled in the art based on the gist of the present invention described in claims or disclosed herein and, not to mention, such variations and changes are encompassed in the scope of the present invention.

The present invention is related to a structure of connecting a plurality of substrates to each other using connectors such as mounting module substrates on a printed board, and can be applied to and is useful for the case where a plurality of substrates are mounted by connecting them using connectors in an information processing apparatus such as a server apparatus and instruments, etc.

What is claimed is:

1. An apparatus comprising:
a first substrate;
a first connector disposed on a top face of the first substrate;
a to-be-fixed member disposed on a back face of the first substrate;
a second substrate disposed above the top face of the first substrate and facing the first substrate;
a second connector disposed on the second substrate and connected to the first connector; and
a fixing module disposed on the second substrate and pivoting a locking arm using a rotating shaft, wherein the to-be-fixed member is pushed by a pushing portion, provided at a tip of the locking arm, being positioned above, immediately on or immediately above the to-be-fixed member when the locking arm is at a first position.

2. An apparatus comprising:
a first substrate;
a first connector disposed on a top face of the first substrate;
a to-be-fixed member disposed on a back face of the first substrate;
a second substrate disposed facing the first substrate;
a second connector disposed on the second substrate and connected to the first connector; and
a fixing module disposed on the second substrate and pivoting a locking arm using a rotating shaft, wherein the to-be-fixed member is pushed by a pushing portion provided at a tip of the locking arm when the locking arm is at a first position, wherein
the fixing module pushes the locking arm to the first position using a spring, and wherein the locking arm is rotatable to a second position different from the first position, and the to-be-fixed member is not pushed by the pushing portion at the second position.

3. The apparatus of claim 1, wherein
the first substrate further includes two positioning pins disposed facing each other in a periphery of the first substrate and position the first connector relative to the second connector, wherein
the fixing module further includes a first positioning groove into which the positioning pins are inserted at predetermined positions, and wherein
the second substrate positions the first substrate relative to the second substrate by disposing two of the fixing modules whose first positioning grooves are inserted with the positioning pins, such that the two fixing modules hold the first substrate sandwiching the first substrate therebetween.

4. An apparatus comprising:
a first substrate;
a first connector disposed on a top face of the first substrate;
a to-be-fixed member disposed on a back face of the first substrate;
a second substrate disposed facing the first substrate;
a second connector disposed on the second substrate and connected to the first connector; and
a fixing module disposed on the second substrate and pivoting a locking arm using a rotating shaft, wherein the to-be-fixed member is pushed by a pushing portion provided at a tip of the locking arm when the locking arm is at a first position, wherein
the pushing portion has a shape that is same as or a substantial T-shape, and wherein
the fixing module further includes a second positioning groove on a back of a face for which a first positioning groove is provided, the first positioning groove being for positioning the first connector.

5. The apparatus of claim 3, wherein
the fixing module further includes an inserting and pulling guiding groove in which a guiding pin is inserted, the guiding pin being formed on an inserting and pulling jig, the inserting and pulling jig inserting the first substrate into the second substrate or pulling out the first substrate from the second substrate, the inserting and pulling guiding groove having a cross section shape that is same as or approximately an L-shape, wherein
the inserting and pulling jig includes a hooking portion to hook the positioning pin and rotates around the guiding pin as a rotation axis, the guiding pin being inserted into the inserting and pulling guiding groove, wherein
the locking arm is pushed down from the first position to the second position by the rotation of the inserting and pulling jig, and wherein
the hooking portion hooks the positioning pin and the first substrate is lifted associated with the rotation.

6. An apparatus comprising:
a first substrate;
a first connector disposed on a top face of the first substrate;
a guiding portion disposed on a back face of the first substrate;
a second substrate disposed above the top face of the first substrate and facing the first substrate;
a second connector disposed on the second substrate and connected to the first connector; and
a fixing module disposed on the second substrate and pivoting a locking arm using a rotating shaft, wherein a detachment preventing portion provided at a tip of the locking arm is positioned immediately above the guiding portion at a first position.

7. A mounting structure for pushing a first substrate having a first connector disposed thereon to a second substrate having a second connecter connected to the first connector, wherein
the first substrate has a to-be-fixed member disposed on a back of a face on which the first connector is disposed, wherein
the second substrate is disposed above the face, on which the first connector on the first substrate is disposed, and has a locking arm including a pushing portion pushing the first substrate and rotatable between a first position and a second position that is different from the first position, and a fixing module pivoting the locking arm using a rotating shaft, and wherein
the to-be-fixed member is pushed by the pushing portion, provided at a tip of the locking arm, being positioned above, immediately on or immediately above the to-be-fixed member at the first position and is not pushed by the pushing portion at the second position.

8. An inserting and pulling jig for inserting a first substrate having two positioning pins disposed facing each other in a periphery of the first substrate into a second substrate or pulling out the first substrate from the second substrate, comprising
aguiding pin that is inserted into an inserting and pulling guiding groove formed on the second substrate; and
two board-like members each disposing the guiding pins thereon, and facing each other and formed such that the each board-like members is rotated around the guiding pin as its rotation axis and, thereby, the board-like members push down locking arms from a first position to a second position, the locking arms being disposed on the second substrate so that the locking arms sandwich the first substrate therebetween to prevent detachment of the first substrate, and wherein
each of the board-like members has a hooking portion to lift the first substrate hooking the guiding pin and the positioning pins.

9. A fixing method for fixing a first substrate that has a first connector disposed on a top face of the first substrate, a to-be-fixed member disposed on a back face of the first substrate, and positioning pins disposed facing each other in a periphery of the first substrate, to a second substrate that has a second connector disposed thereon and connected to the first connector, using a fixing module that fixes the first substrate disposed on the second substrate, comprising:
positioning the first substrate relative to the second substrate by inserting the positioning pins into a positioning groove of the fixing module;
connecting the first connector to the second connector; and
rotating a locking arm pivoted by a rotating shaft to a position at which a pushing portion provided at a tip of the locking arm pushes the to-be-fixed member, wherein
the insertion of the positioning pins into the positioning groove is executed by a pin pushing portion of a jig, the pin pushing portion pushing down the positioning pins by rotation of the jig, the jig being for inserting the first substrate into the second substrate.

* * * * *

UNITED STATES PATENT AND TRADEMARK OFFICE
CERTIFICATE OF CORRECTION

| | | |
|---|---|---|
| PATENT NO. | : 8,007,299 B2 | Page 1 of 1 |
| APPLICATION NO. | : 12/767353 | |
| DATED | : August 30, 2011 | |
| INVENTOR(S) | : Hajime Murakami et al. | |

It is certified that error appears in the above-identified patent and that said Letters Patent is hereby corrected as shown below:

Column 24, Line 30, (Approx.), in Claim 8, delete "aguiding" and insert --a guiding--, therefor.

Signed and Sealed this
Twenty-second Day of November, 2011

David J. Kappos
*Director of the United States Patent and Trademark Office*